(12) United States Patent
Liao et al.

(10) Patent No.: US 11,545,562 B2
(45) Date of Patent: Jan. 3, 2023

(54) SOURCE AND DRAIN STRUCTURE WITH REDUCED CONTACT RESISTANCE AND ENHANCED MOBILITY

(71) Applicant: Taiwan Semiconductor Manufacturing Co., Ltd., Hsin-Chu (TW)

(72) Inventors: Chih-Teng Liao, Hsinchu (TW); Chih-Shan Chen, New Taipei (TW); Yi-Wei Chiu, Kaohsiung (TW); Chih Hsuan Cheng, Miaoli County (TW); Tzu-Chan Weng, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/715,347

(22) Filed: Dec. 16, 2019

(65) Prior Publication Data

US 2020/0119161 A1 Apr. 16, 2020

Related U.S. Application Data

(62) Division of application No. 16/000,689, filed on Jun. 5, 2018, now Pat. No. 10,510,875.

(Continued)

(51) Int. Cl.
*H01L 21/70* (2006.01)
*H01L 29/66* (2006.01)
(Continued)

(52) U.S. Cl.
CPC .... *H01L 29/6681* (2013.01); *H01L 21/30625* (2013.01); *H01L 21/324* (2013.01);
(Continued)

(58) Field of Classification Search
CPC ............ H01L 21/30625; H01L 21/324; H01L 21/823418; H01L 21/823431;
(Continued)

(56) References Cited

U.S. PATENT DOCUMENTS 6,483,156 B1 * 11/2002 Adkisson .......... H01L 21/76264
257/288
7,638,843 B2 * 12/2009 Xiong ................... H01L 21/845
257/347

(Continued)

FOREIGN PATENT DOCUMENTS

CN 103094362 A 5/2013
CN 103177963 A 6/2013
(Continued)

OTHER PUBLICATIONS

Yun Zheng, "Electronic Properties of Silicon Nanowires," IEEE Transactions on Electron Devices, vol. 52, No. 6, Jun. 2005, pp. 1097-1103.

*Primary Examiner* — Jay C Kim
(74) *Attorney, Agent, or Firm* — Haynes and Boone, LLP

(57) ABSTRACT

A method includes forming a fin structure on the substrate, wherein the fin structure includes a first fin active region; a second fin active region; and an isolation feature separating the first and second fin active regions; forming a first gate stack on the first fin active region and a second gate stack on the second fin active region; performing a first recessing process to a first source/drain region of the first fin active region by a first dry etch; performing a first epitaxial growth to form a first source/drain feature on the first source/drain region; performing a fin sidewall pull back (FSWPB) process to remove a dielectric layer on the second fin active region; and performing a second epitaxial growth to form a (Continued)

second source/drain feature on a second source/drain region of the second fin active region.

20 Claims, 48 Drawing Sheets

Related U.S. Application Data

(60) Provisional application No. 62/539,188, filed on Jul. 31, 2017.

(51) Int. Cl.
| | | |
|---|---|---|
| *H01L 21/8234* | (2006.01) | |
| *H01L 21/324* | (2006.01) | |
| *H01L 29/78* | (2006.01) | |
| *H01L 29/417* | (2006.01) | |
| *H01L 29/08* | (2006.01) | |
| *H01L 21/306* | (2006.01) | |
| *H01L 27/092* | (2006.01) | |
| *H01L 21/8238* | (2006.01) | |
| *H01L 29/06* | (2006.01) | |
| H01L 21/84 | (2006.01) | |

(52) U.S. Cl.
CPC ......... *H01L 21/823418* (2013.01); *H01L 21/823431* (2013.01); *H01L 21/823814* (2013.01); *H01L 21/823821* (2013.01); *H01L 21/823842* (2013.01); *H01L 27/092* (2013.01); *H01L 29/0653* (2013.01); *H01L 29/0847* (2013.01); *H01L 29/41791* (2013.01); *H01L 29/66545* (2013.01); *H01L 29/785* (2013.01); *H01L 29/7848* (2013.01); H01L 21/845 (2013.01)

(58) Field of Classification Search
CPC ..... H01L 21/823814; H01L 21/823821; H01L 21/823842; H01L 21/845; H01L 27/092; H01L 29/0653; H01L 29/0847; H01L 29/41791; H01L 29/66545; H01L 29/6681; H01L 29/7848; H01L 29/785
See application file for complete search history.

(56) References Cited

U.S. PATENT DOCUMENTS

| | | | | |
|---|---|---|---|---|
| 8,263,451 B2* | 9/2012 | Su | H01L 21/823431 | 257/190 |
| 8,362,574 B2* | 1/2013 | Kawasaki | H01L 29/66795 | 257/401 |
| 8,377,779 B1* | 2/2013 | Wang | H01L 29/66484 | 438/283 |
| 8,399,938 B2 | 3/2013 | Cheng et al. | | |
| 8,460,984 B2* | 6/2013 | Wahl | H01L 22/20 | 438/164 |
| 8,476,706 B1* | 7/2013 | Chidambarrao | H01L 29/66651 | 257/338 |
| 8,569,125 B2* | 10/2013 | Standaert | H01L 29/785 | 438/197 |
| 8,610,241 B1* | 12/2013 | Hu | H01L 27/0623 | 257/526 |
| 8,669,615 B1* | 3/2014 | Chang | H01L 27/1211 | 257/347 |
| 8,703,556 B2* | 4/2014 | Kelly | H01L 29/7851 | 257/296 |
| 8,759,904 B2* | 6/2014 | Wahl | H01L 21/845 | 257/328 |
| 8,772,109 B2 | 7/2014 | Colinge | | |
| 8,785,285 B2 | 7/2014 | Tsai et al. | | |
| 8,816,444 B2 | 8/2014 | Wann et al. | | |
| 8,823,065 B2 | 9/2014 | Wang et al. | | |
| 8,836,046 B2* | 9/2014 | Maeda | H01L 29/4966 | 257/401 |
| 8,860,148 B2 | 10/2014 | Hu et al. | | |
| 9,000,489 B2* | 4/2015 | Lu | H01L 29/41791 | 257/202 |
| 9,093,550 B1* | 7/2015 | Zhao | H01L 21/82 | |
| 9,105,490 B2 | 8/2015 | Wang et al. | | |
| 9,117,842 B2* | 8/2015 | Wei | H01L 29/66545 | |
| 9,236,267 B2 | 1/2016 | De et al. | | |
| 9,236,300 B2 | 1/2016 | Liaw | | |
| 9,287,382 B1* | 3/2016 | Lee | H01L 21/823821 | |
| 9,299,811 B2* | 3/2016 | Kim | H01L 29/66795 | |
| 9,331,080 B2* | 5/2016 | Eom | H01L 21/823814 | |
| 9,397,099 B1* | 7/2016 | Huang | H01L 21/823431 | |
| 9,425,310 B2* | 8/2016 | Yang | H01L 29/785 | |
| 9,520,482 B1 | 12/2016 | Chang et al. | | |
| 9,576,814 B2 | 2/2017 | Wu et al. | | |
| 9,595,611 B2* | 3/2017 | Kim | H01L 27/1211 | |
| 9,627,481 B2* | 4/2017 | Park | H01L 29/7856 | |
| 9,640,533 B2* | 5/2017 | Lim | H01L 29/0649 | |
| 9,647,113 B2* | 5/2017 | Cheng | H01L 29/785 | |
| 9,666,582 B1* | 5/2017 | Li | H01L 27/0886 | |
| 9,768,255 B2* | 9/2017 | Lee | H01L 29/785 | |
| 9,786,510 B2* | 10/2017 | Shen | H01L 21/30604 | |
| 9,793,273 B2* | 10/2017 | Liaw | H01L 29/66545 | |
| 9,793,356 B2* | 10/2017 | Yoo | H01L 21/823821 | |
| 9,812,363 B1* | 11/2017 | Liao | H01L 29/0649 | |
| 9,831,116 B2* | 11/2017 | Lee | H01L 21/764 | |
| 9,882,004 B2* | 1/2018 | Jung | H01L 29/0653 | |
| 9,899,268 B2* | 2/2018 | Wei | H01L 29/7848 | |
| 9,935,199 B2* | 4/2018 | Ching | H01L 21/823418 | |
| 9,941,277 B2* | 4/2018 | Yoon | H01L 29/66795 | |
| 9,991,257 B2* | 6/2018 | Park | H01L 29/0649 | |
| 10,050,030 B2* | 8/2018 | Huang | H01L 29/0611 | |
| 10,062,772 B2* | 8/2018 | Huang | H01L 29/7848 | |
| 10,103,249 B2* | 10/2018 | Lee | H01L 29/66795 | |
| 10,147,650 B2* | 12/2018 | Kim | H01L 29/0847 | |
| 10,163,635 B1* | 12/2018 | Qi | H01L 21/31105 | |
| 10,164,042 B2* | 12/2018 | Yeo | H01L 21/823425 | |
| 10,164,098 B2* | 12/2018 | Huang | H01L 29/785 | |
| 10,217,815 B1* | 2/2019 | Chu | H01L 21/02057 | |
| 10,269,932 B1* | 4/2019 | Arya | H01L 29/0847 | |
| 10,297,601 B2* | 5/2019 | Kim | H01L 29/41791 | |
| 10,319,581 B1* | 6/2019 | Wen | H01L 21/31056 | |
| 10,388,791 B2* | 8/2019 | Kim | H01L 27/1211 | |
| 10,453,943 B2* | 10/2019 | Lin | H01L 29/7848 | |
| 10,490,552 B2* | 11/2019 | Lee | H01L 21/30625 | |
| 10,510,762 B2* | 12/2019 | Chiou | H01L 29/66795 | |
| 10,529,837 B1* | 1/2020 | Hung | H01L 29/732 | |
| 10,680,106 B2* | 6/2020 | More | H01L 29/0924 | |
| 10,707,328 B2* | 7/2020 | Sung | H01L 29/66795 | |
| 10,727,131 B2* | 7/2020 | Li | H01L 21/823431 | |
| 10,872,889 B2* | 12/2020 | Chen | H01L 27/0886 | |
| 10,896,957 B2* | 1/2021 | Cho | H01L 27/1104 | |
| 11,031,286 B2* | 6/2021 | Loh | H01L 21/823425 | |
| 11,037,924 B2* | 6/2021 | Koh | H01L 21/302 | |
| 2005/0035402 A1 | 2/2005 | Venkatraman et al. | | |
| 2007/0045736 A1* | 3/2007 | Yagishita | H01L 29/045 | 257/347 |
| 2008/0157225 A1* | 7/2008 | Datta | H01L 27/1116 | 257/401 |
| 2012/0313169 A1* | 12/2012 | Wahl | H01L 21/845 | 257/347 |
| 2013/0285146 A1 | 10/2013 | Tung | | |
| 2014/0106529 A1* | 4/2014 | Morin | H01L 29/41791 | 438/283 |
| 2014/0203370 A1* | 7/2014 | Maeda | H01L 29/41791 | 257/365 |
| 2014/0217517 A1* | 8/2014 | Cai | H01L 29/41791 | 257/401 |
| 2014/0273365 A1* | 9/2014 | Wei | H01L 21/845 | 438/199 |
| 2016/0284697 A1* | 9/2016 | Yoon | H01L 27/088 | |
| 2016/0358911 A1 | 12/2016 | Chen et al. | | |
| 2017/0077096 A1 | 3/2017 | Wu | | |

(56) References Cited

U.S. PATENT DOCUMENTS

2017/0133286 A1\* 5/2017 Sung .............. H01L 21/823821
2017/0207126 A1\* 7/2017 Ching .............. H01L 21/26586

FOREIGN PATENT DOCUMENTS

| CN | 104103577 A | 10/2014 |
| CN | 104347425 A | 2/2015 |
| CN | 105023944 A | 11/2015 |
| CN | 105931968 A | 9/2016 |
| CN | 106206301 A | 12/2016 |
| CN | 106206437 A | 12/2016 |
| CN | 106601677 A | 4/2017 |
| KR | 20140023200 A | 2/2014 |
| KR | 20170032823 A | 3/2017 |
| TW | 201409553 A | 3/2014 |
| WO | 2013158864 A1 | 10/2013 |

\* cited by examiner

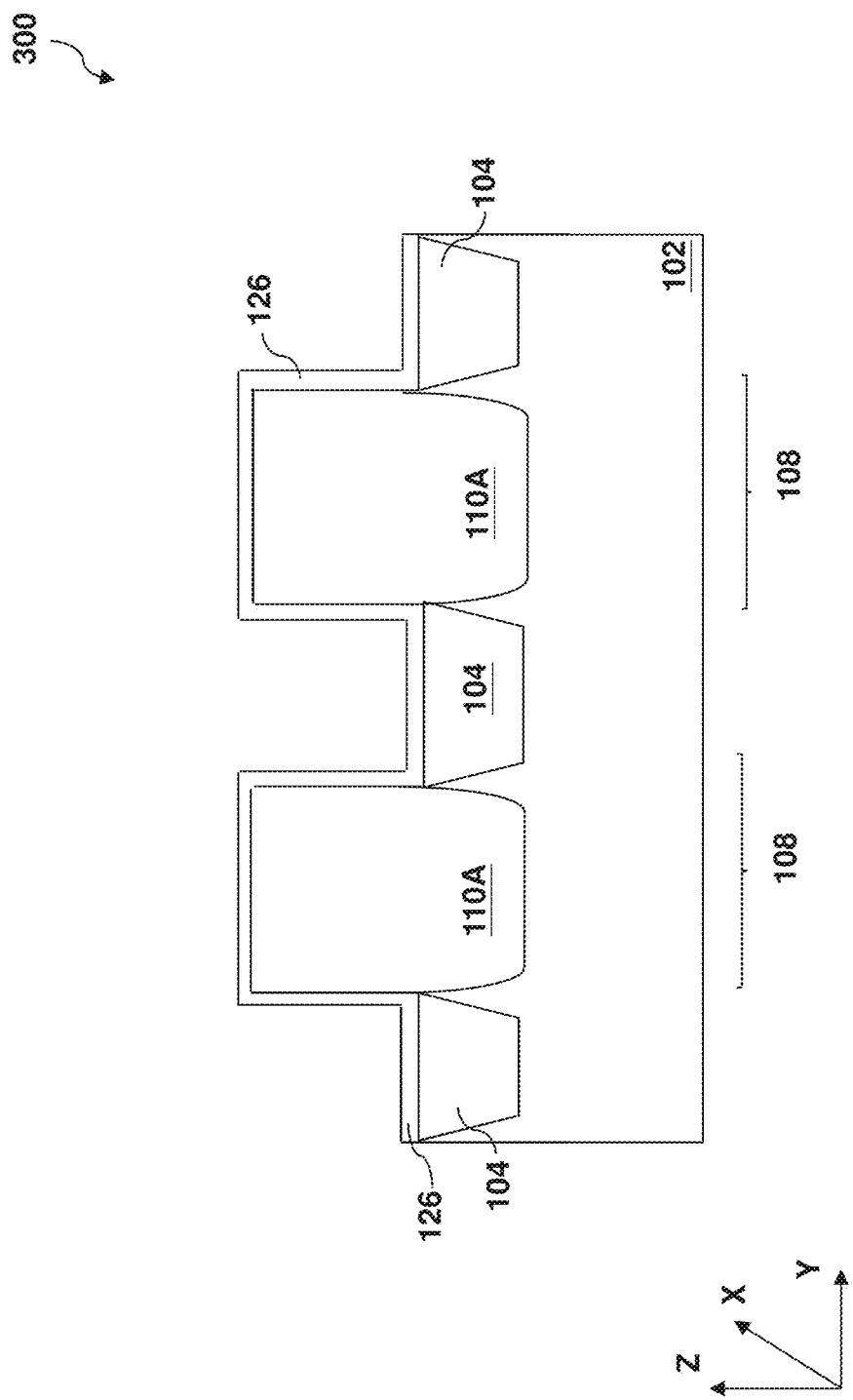

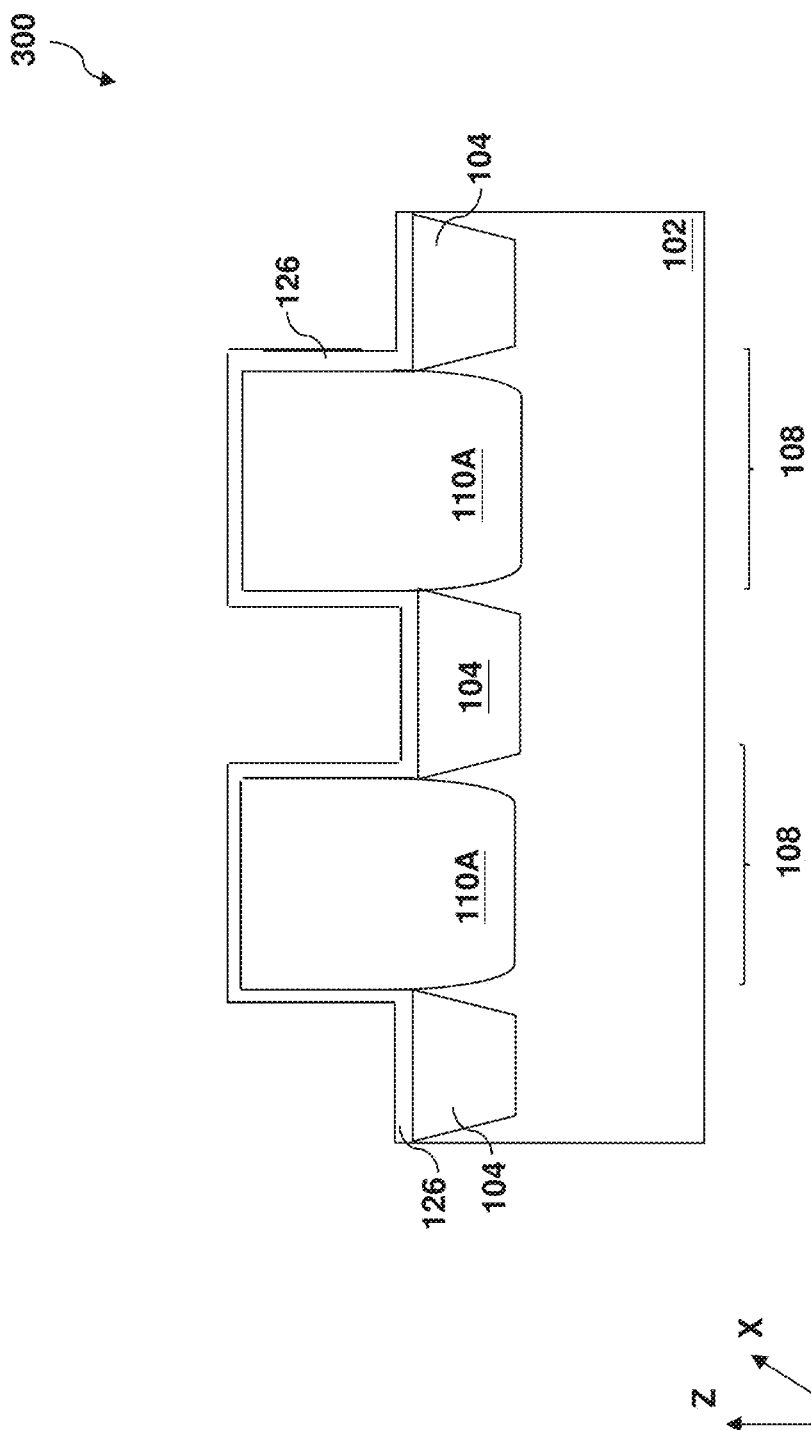

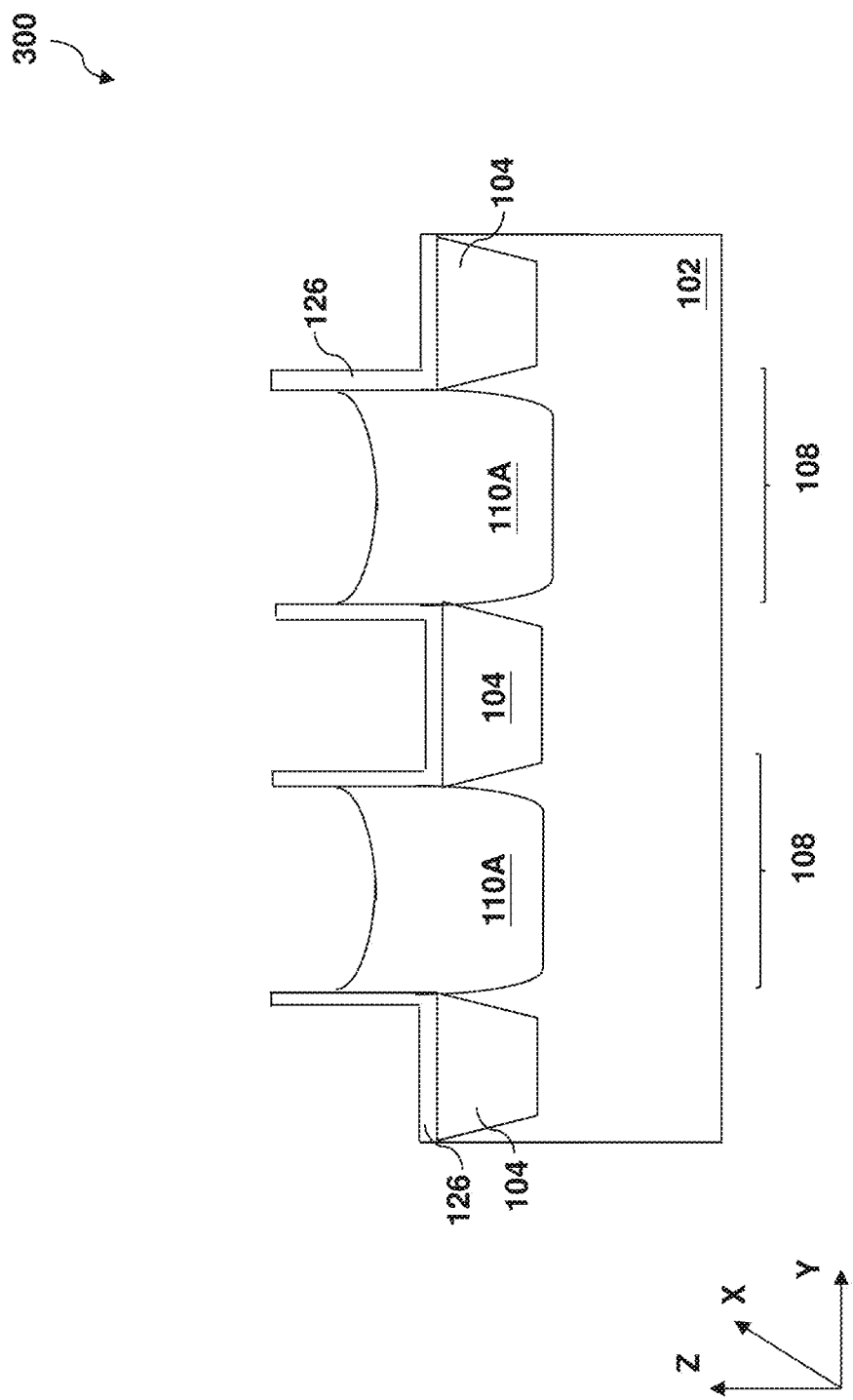

SOURCE AND DRAIN STRUCTURE WITH REDUCED CONTACT RESISTANCE AND ENHANCED MOBILITY

CROSS REFERENCE

This application is a Divisional of U.S. patent application Ser. No. 16/000,689, filed Jun. 5, 2018, which claims the benefit of U.S. Provisional Application 62/539,188, entitled "SEMICONDUCTOR DEVICES WITH RESPECTIVE PROFILES AND METHOD MAKING THE SAME," filed Jul. 31, 2017, the entire disclosures of which are herein incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. FinFETs are compatible with conventional complementary metal-oxide-semiconductor (CMOS) processes and their three-dimensional structure allows them to be aggressively scaled while maintaining gate control and mitigating SCEs. By way of example, the FinFET fabrication process may include forming epitaxial grown source and drain features by etching and selective epitaxial growth to have strain effect. Thus formed source and drain features by the existing method may cause defect issue, such as dislocation variation, and degrade device performance. In some cases, the source/drain features are designed differently due to respective specification requirements. The existing method is not effectively to form various source and drain features with respective characteristics. Other issues may include contact resistance. Therefore, what is needed is a structure and a method making the same to address the above issues.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 5D, 6D, 7D, 8D, 9D, 10D, 11D, 12D, and 13D are sectional views of the workpiece taken along the dashed line CC' at various fabrication stages of the method making the workpiece according to various aspects of the present disclosure.

DETAILED DESCRIPTION

Figure 1:
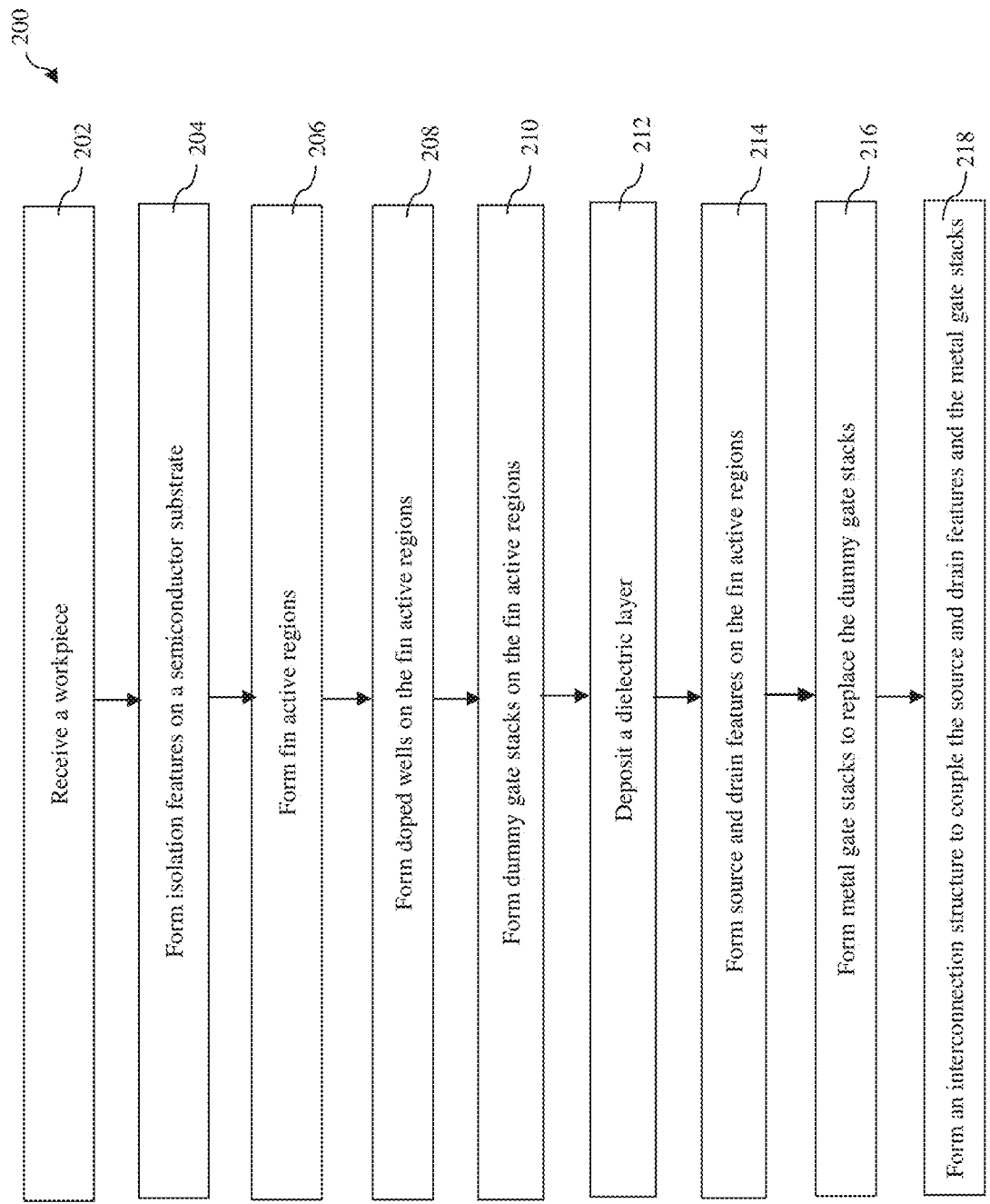
FIGS. 1 and 2 are flow diagrams of a method of fabricating a workpiece according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations beyond the extent noted.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

It is noted that the present disclosure presents embodiments in the form of multi-gate transistors or fin-type multi-gate transistors referred to herein as FinFET devices. Such a device may include a P-type metal-oxide-semiconductor FinFET device or an N-type metal-oxide-semiconductor FinFET device. The FinFET device may be a dual-gate device, tri-gate device, bulk device, silicon-on-insulator (SOI) device, and/or other configuration. One of ordinary skill may recognize other embodiments of semiconductor devices that may benefit from aspects of the present disclosure. For example, some embodiments as described herein may also be applied to gate-all-around (GAA) devices, Omega-gate (Ω-gate) devices, or Pi-gate (Π-gate) devices.

The present disclosure is generally related to semiconductor devices and fabrication. More particularly, some embodiments are related to forming source and drain features, such as along with device fin active regions. Furthermore, the disclosed method provides an approach to form source and drain features with increased strain effect, decreased contact resistance and further with additional freedom to form source and drain features with respective characteristics. In some examples, these source and drain features are formed by a procedure including two step etching: the first etching step to etch the fin for recessing the source and drain regions; and the second etching step to remove the dielectric layer on the sidewalls of the fin active regions.

Embodiments of the present disclosure offer various advantages, though it is understood that other embodiments may offer different advantages, not all advantages are necessarily discussed herein, and no particular advantage is required for all embodiments. In at least some embodiments, by forming the expitaxial grown source and drain features, the carrier mobility is increased, and the device performance is enhanced.

Figure 2:
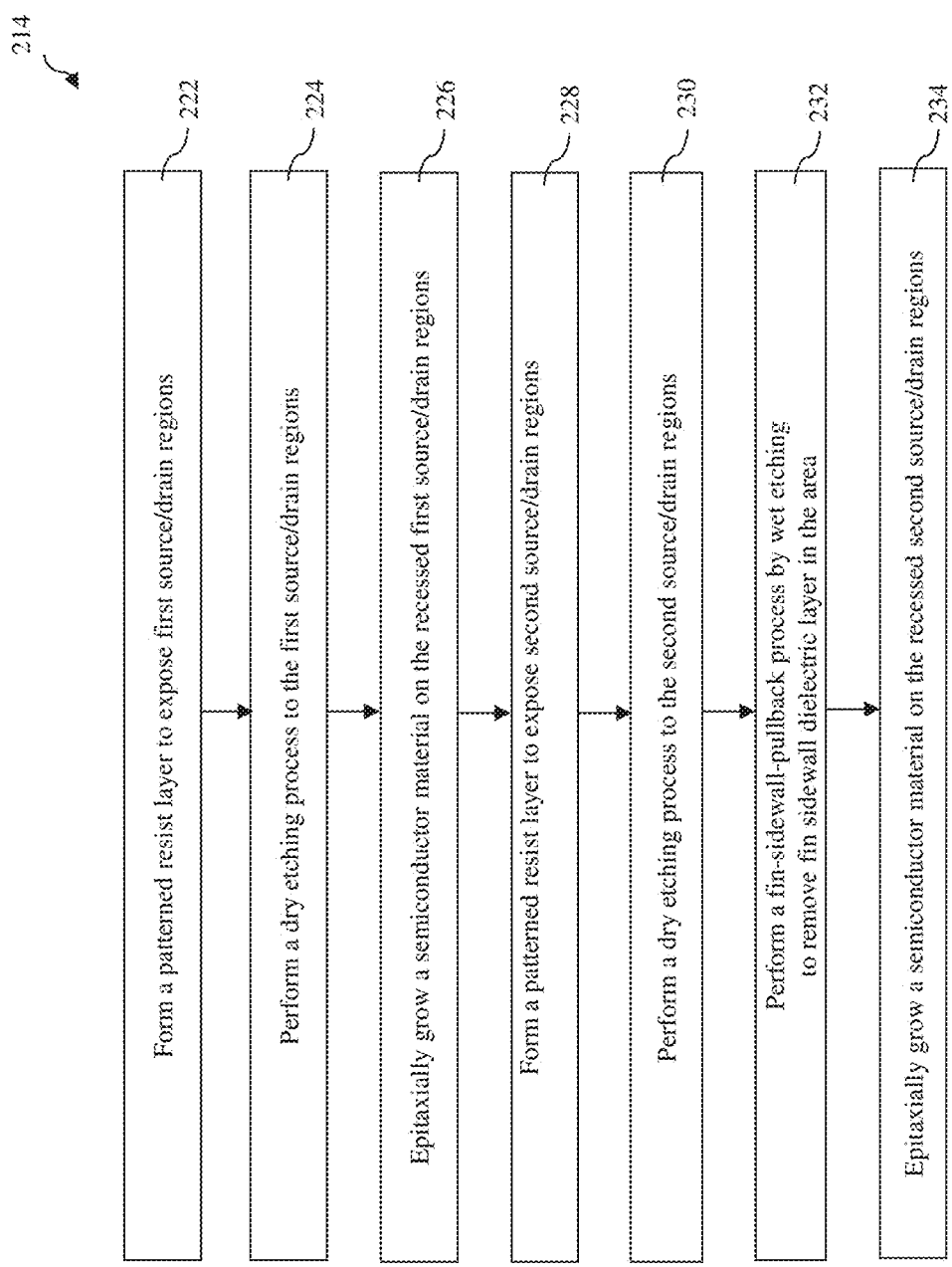
Figure 13A:
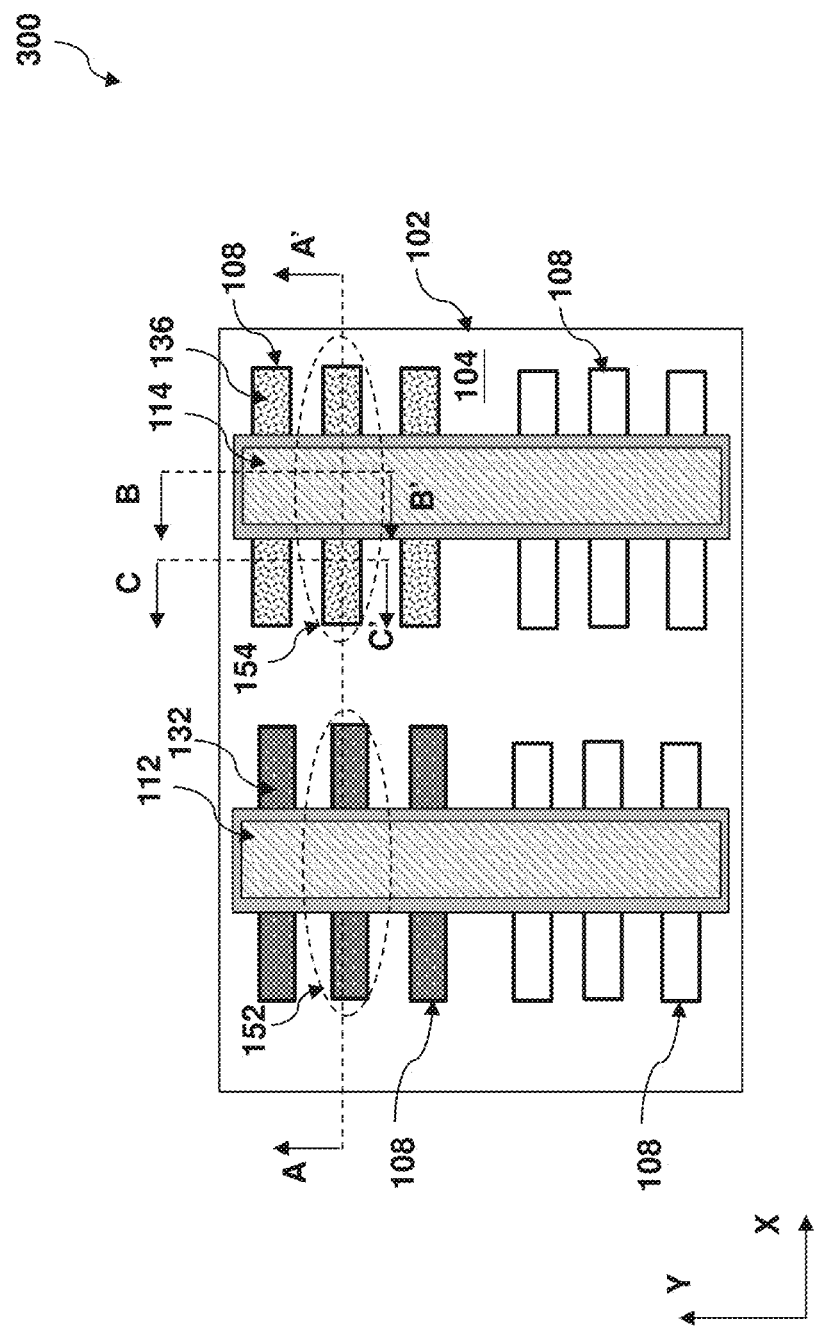
Figure 13B:
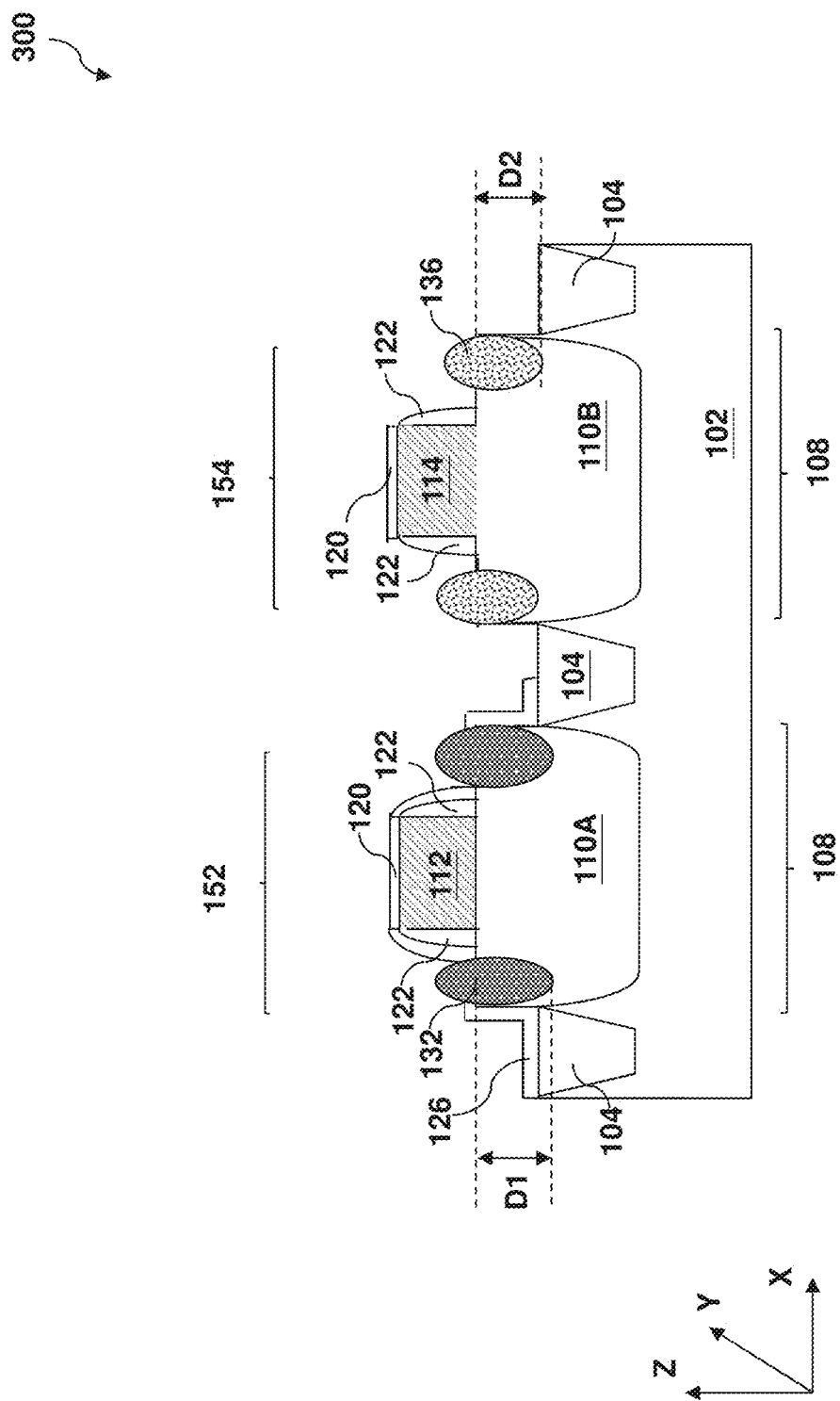
Figure 13C:
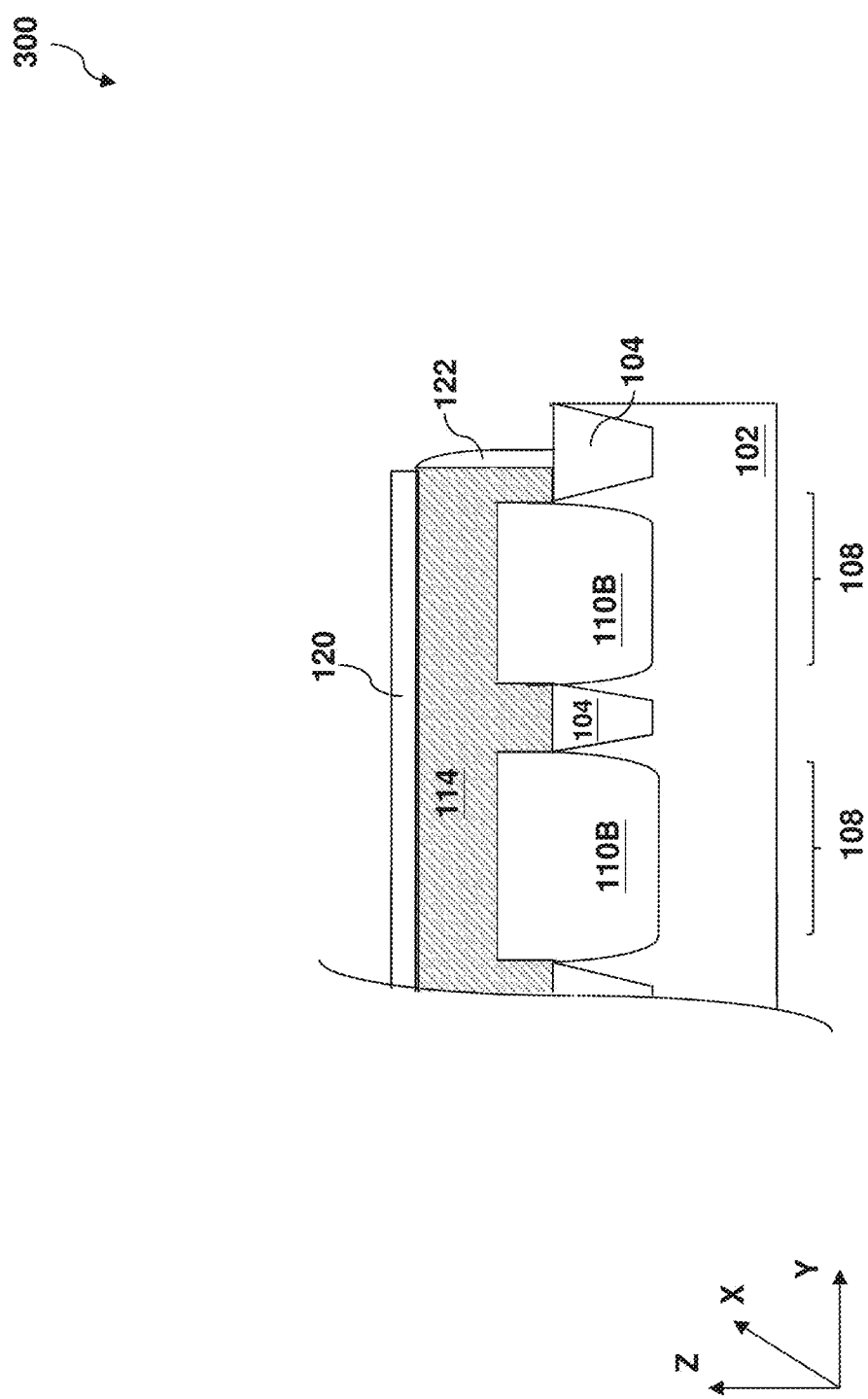
Figure 13D:
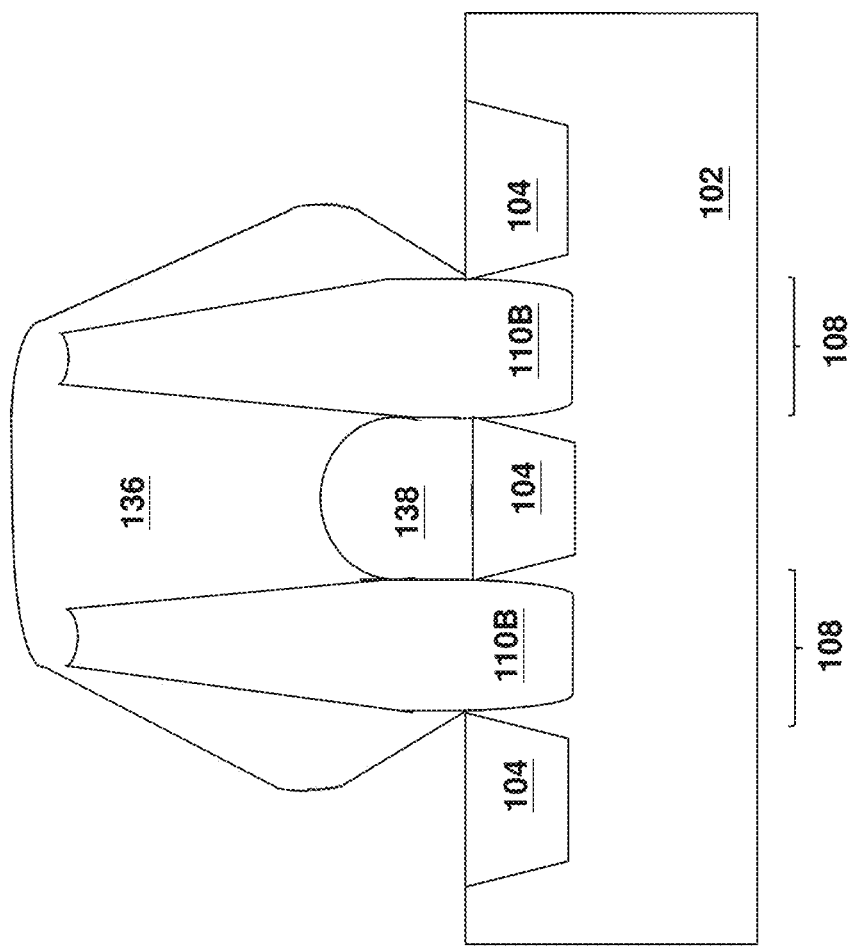
Figure 14A:
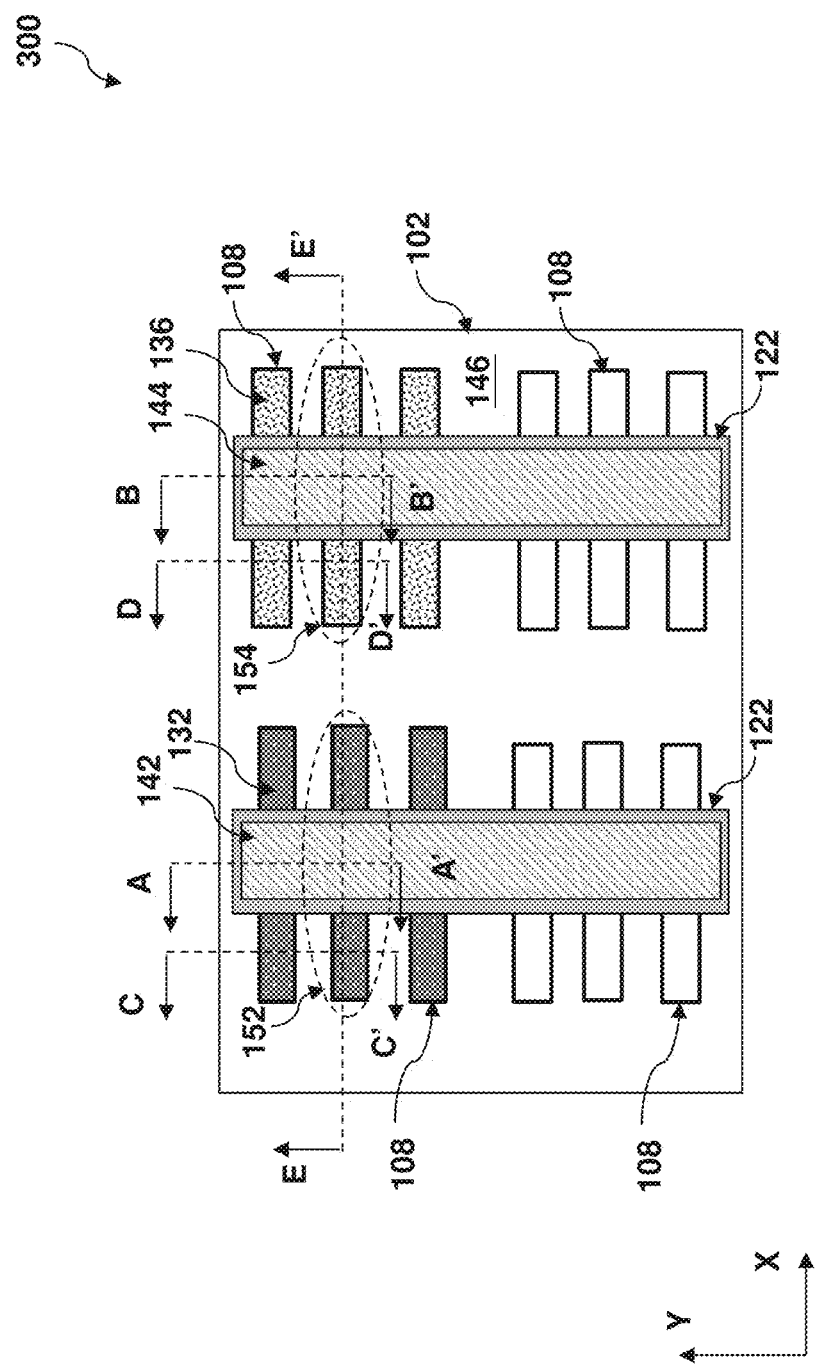
FIG. 14A is a top view of the workpiece at a stage of the method of fabricating the workpiece according to various aspects of the present disclosure.

FIG. 1 is a flowchart of the method 200 for making a workpiece (also referred to as a semiconductor structure) 300 having various FETs. FIG. 2 is a flowchart of the method 214 for making the source/drain features of the semiconductor structure 300. FIGS. 3A, 4A, 5A, 6A, 7A, 8A, 9A, 10A, 11A, 12A, and 13A are top views of the workpiece 300 at various fabrication stages. FIGS. 3B, 4B, 5B, 6B, 7B, 8B, 9B, 10B, 11B, 12B, and 13B are sectional views of the workpiece 300 taken along the dashed line AA' at various fabrication stages. FIGS. 5C, 6C, 7C, 8C, 9C, 10C, 11C, 12C, and 13C are sectional views of the workpiece 300 taken along the dashed line BB' at various fabrication stages. FIGS. 5D, 6D, 7D, 8D, 9D, 10D, 11D, 12D, and 13D are sectional views of the workpiece 300 taken along the dashed line CC' at various fabrication stages. FIG. 14A is a top view of the semiconductor structure 300 at a fabrication stage. FIGS. 14B, 14C, 14D, 14E, and 14F are sectional views of the semiconductor structure 300 of FIG. 14A, taken along the dashed lines AA', BB', CC', DD' and EE', respectively, in accordance with some embodiments.

The method 200 is described below in conjunction with FIGS. 1 through 14F. Additional steps can be provided before, during, and after the method 200, and some of the steps described can be replaced or eliminated for other embodiments of the method 200.

Figure 3A:
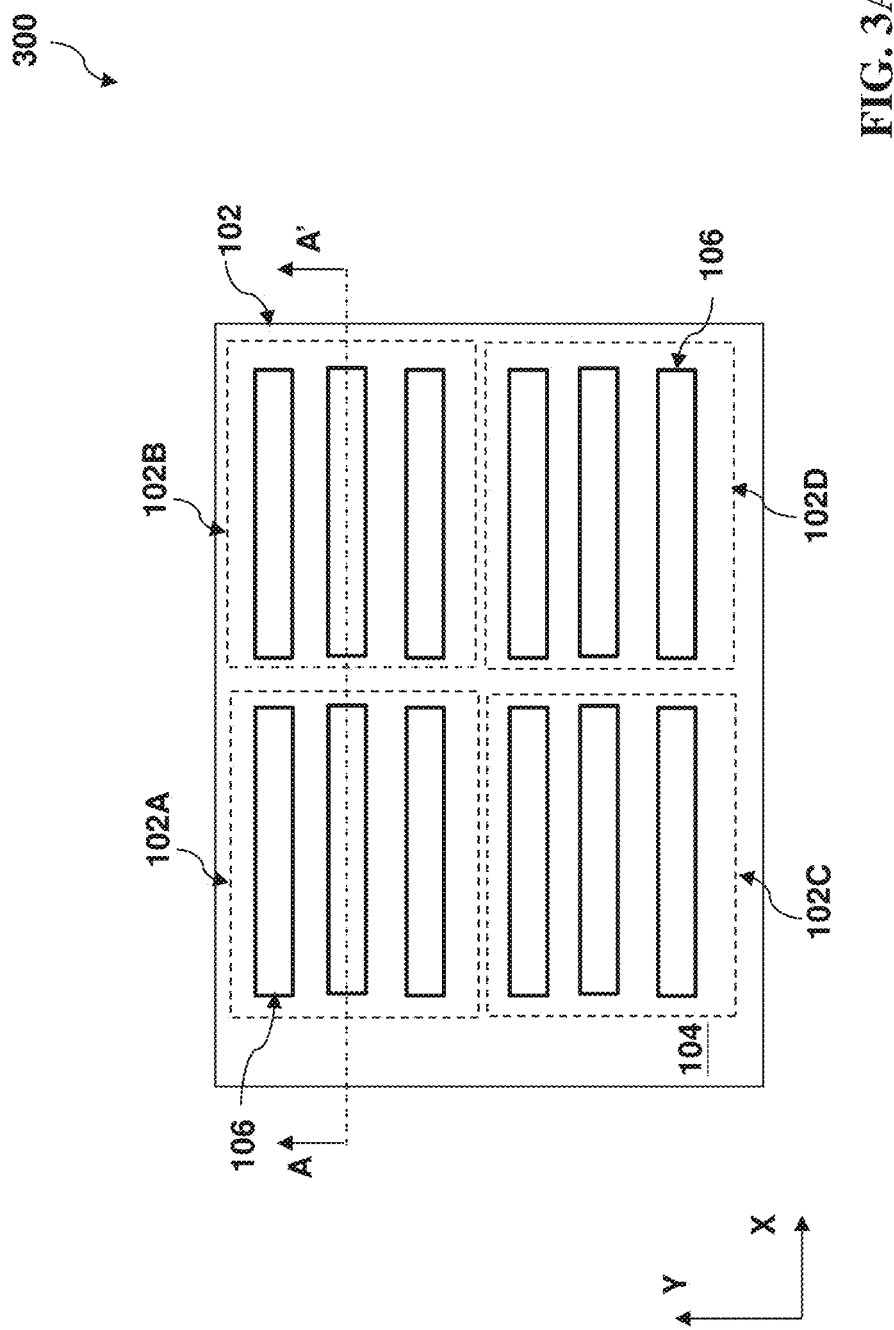
FIGS. 3A, 4A, 5A, 6A, 7A, 8A, 9A, 10A, 11A, 12A, and 13A are top views of the workpiece at various fabrication stages of the method making the workpiece according to various aspects of the present disclosure.
Figure 3B:
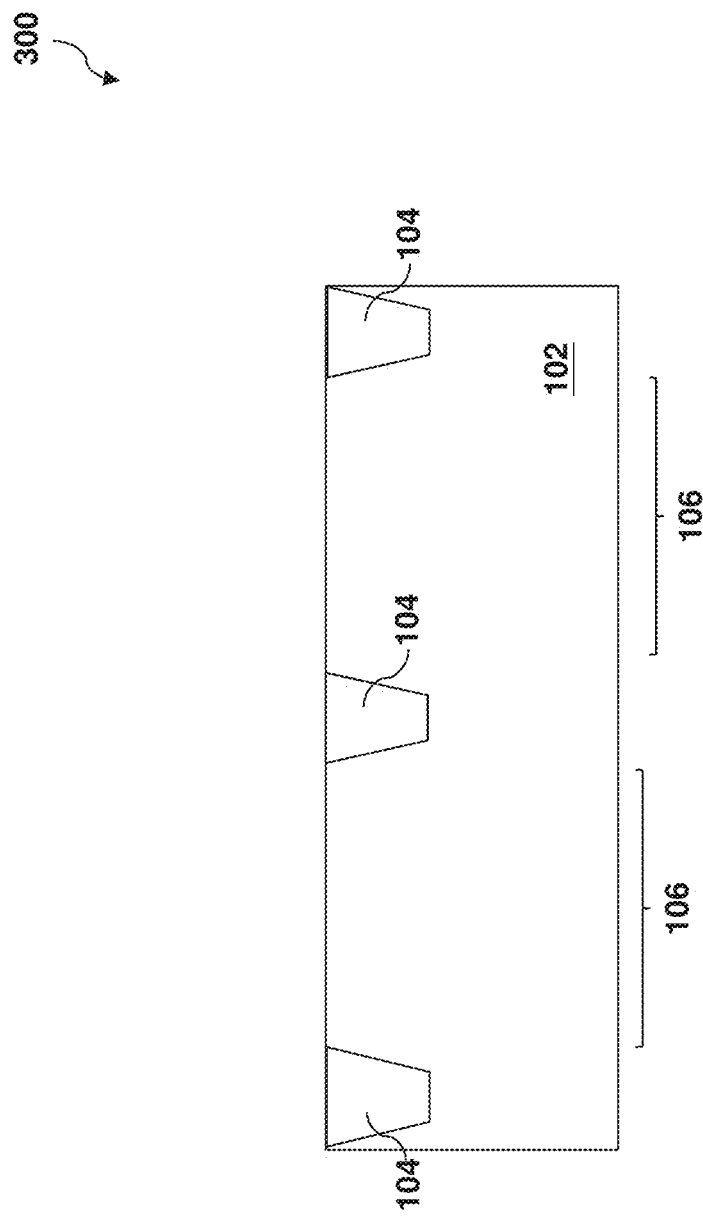
FIGS. 3B, 4B, 5B, 6B, 7B, 8B, 9B, 10B, 11B, 12B, and 13B are sectional views of the workpiece taken along the dashed line AA' at various fabrication stages of the method making the workpiece according to various aspects of the present disclosure.

Referring first to block 202 of FIG. 1 and to FIGS. 3A-3B, the workpiece 300 is received that includes a substrate 102. In various examples, the substrate 102 includes an elementary (single element) semiconductor, such as silicon or germanium in a crystalline structure; a compound semiconductor, such as silicon germanium, silicon carbide, gallium arsenic, gallium phosphide, indium phosphide, indium arsenide, and/or indium antimonide; a non-semiconductor material, such as soda-lime glass, fused silica, fused quartz, and/or calcium fluoride ($CaF_2$); and/or combinations thereof.

The substrate 102 may be uniform in composition or may include various layers. The layers may have similar or different compositions, and in various embodiments, some substrate layers have non-uniform compositions to induce device strain and thereby tune device performance. Examples of layered substrates include silicon-on-insulator (SOI) substrates 102. In some such examples, a layer of the substrate 102 may include an insulator such as a silicon oxide, a silicon nitride, a silicon oxynitride, a silicon carbide, and/or other suitable insulator materials.

Still referring to block 204 of FIG. 1 and FIGS. 3A-3B, the method 200 includes an operation to form isolation features 104 in the semiconductor substrate 102, thereby defining first active regions 106 separated from each other by the isolation feature 104. The formation of the isolation features may include forming a patterned mask by lithography; etching the substrate 102 through the openings of the patterned mask to form trenches; filling the trench with one or more dielectric material; and performing a CMP process. The substrate 102 may include various areas for different devices to be formed thereon. As an example for illustration, the substrate 102 includes four exemplary areas 102A, 102B, 102C and 102D. The first area 102A and the third area 102C are designed for logic devices to be formed thereon. The second area 102B and the fourth area 102D are designed for memory devices, such as static random-access memory (SRAM) devices to be formed thereon. Furthermore, in the first area 102A, n-type FETs (nFETs) for the logic devices are formed thereon; in the second area 102B, nFETs for the memory devices are formed thereon; in the third area 102C, p-type FETs (pFETs) for the logic devices are formed thereon; and in the fourth area 102D, pFETs for the memory devices are formed thereon. The following detailed descriptions of the method 200 are directly to the FETs in the first area 102A and second area 102B only for simplicity.

In some embodiments, the active regions are three-dimensional, such as fin active regions. Those FETs formed on those fin active regions are referred to FinFETs accordingly. Referring to block 206 of FIG. 1 and FIGS. 4A and 4B, the method 200 further includes an operation 206 to form fin active regions 108 extruded above the isolation features 104. Those fin active regions also collectively referred to as a fin structure 108. In some embodiments, the fin active regions 108 may be formed by selective etching to recess the isolation features 104. In other embodiments, the fin active regions 108 may be formed by selective epitaxial growth to the active regions with one or more semiconductor material. In yet some embodiments, the fin active regions 108 may be formed by a hybrid procedure having both selective etching to recess and selective epitaxial growth. In yet some embodiments, the operations 204 and 206 may be replaced by a different procedure to form fin active regions 106 and the isolation features 104. For examples, the fin active regions 106 are formed by patterning the substrate 102 and then the isolation features 104 are formed by deposition and CMP.

The fin active regions 108 may have elongated shape oriented along the X direction. The epitaxial grown semiconductor material may include silicon, germanium, silicon germanium, silicon carbide or other suitable semiconductor materials. The selective etching process may include wet etching, dry etching, other suitable etching or a combination thereof.

Figure 4A:
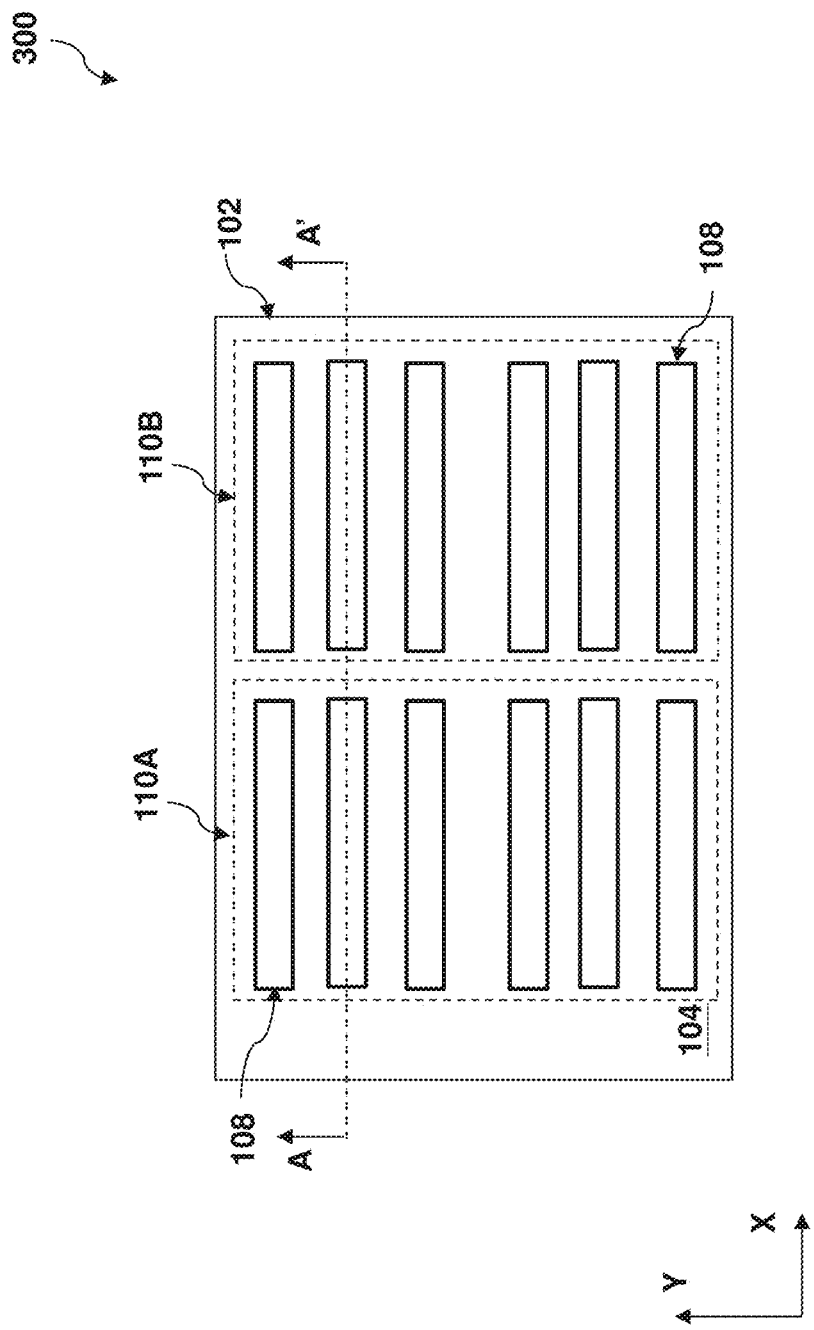
Figure 4B:
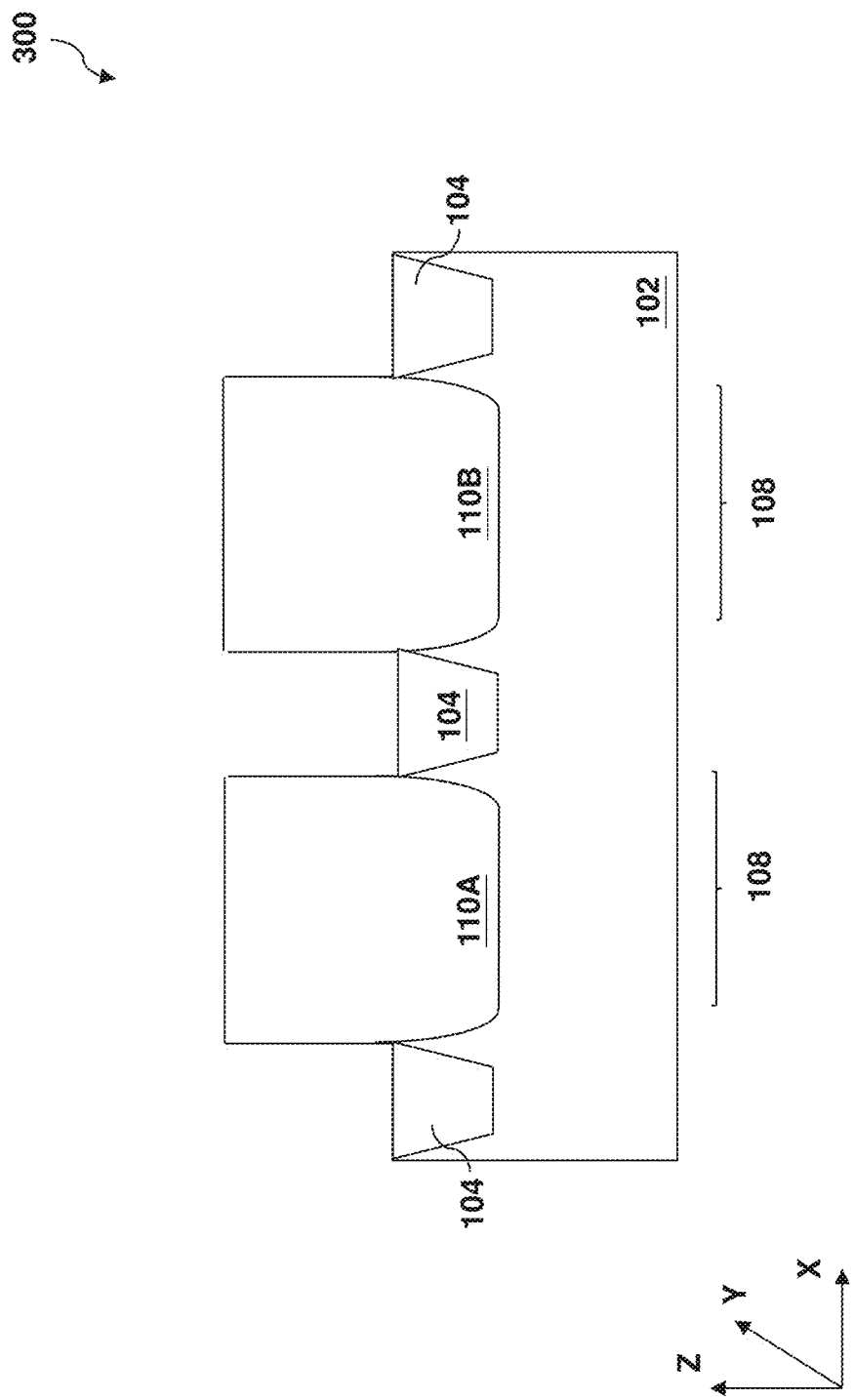
Figure 5A:
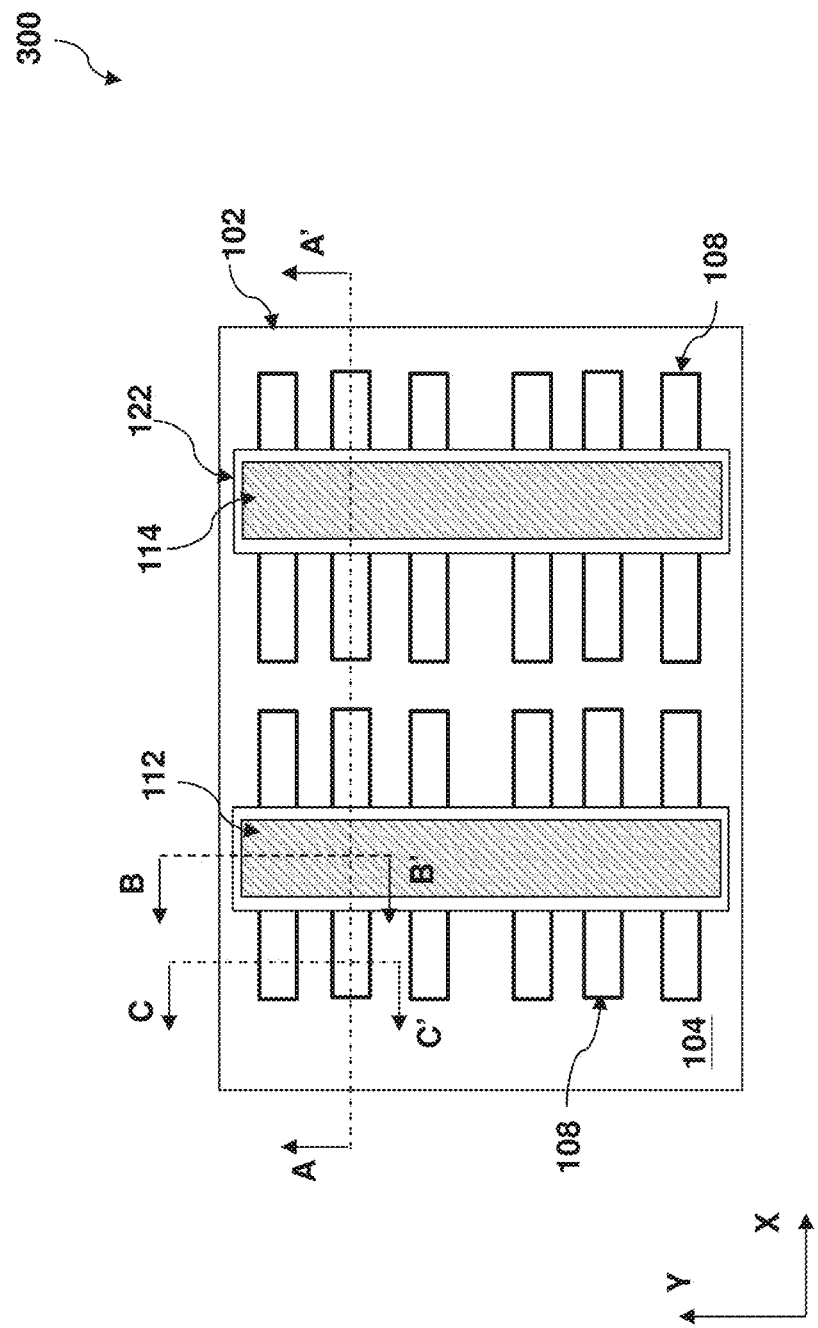
Figure 5B:
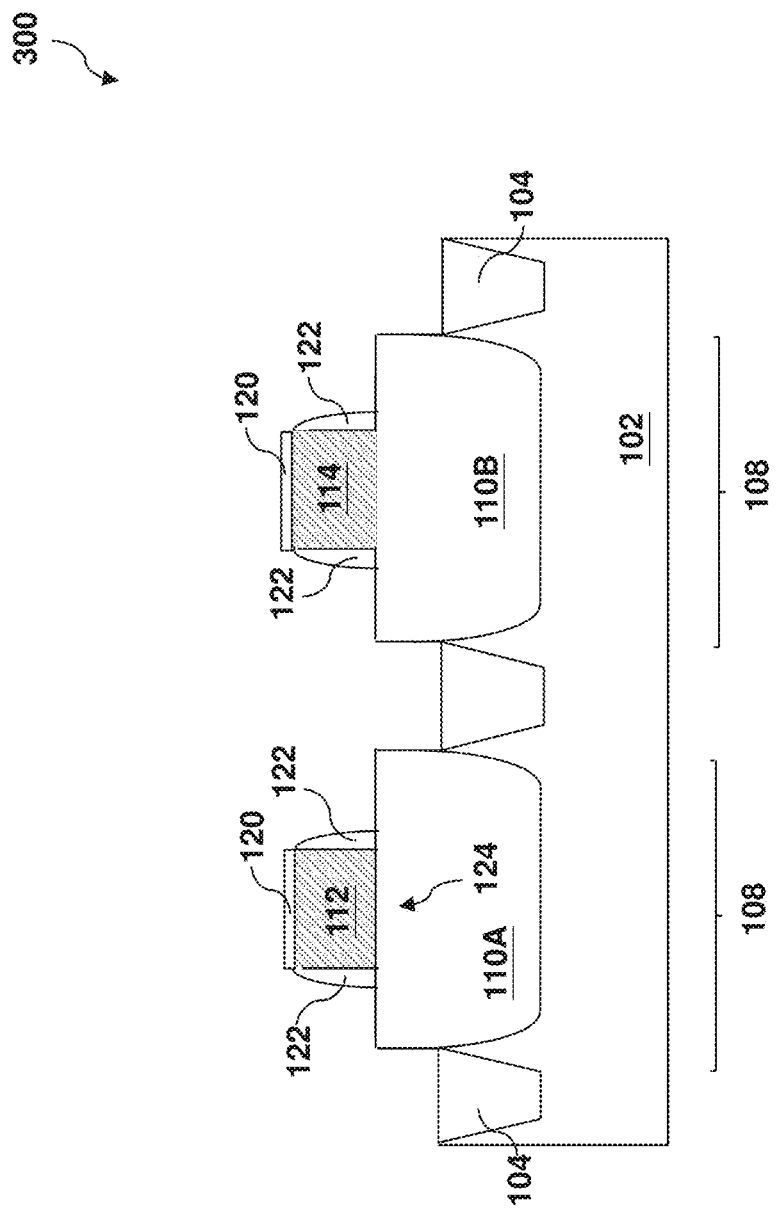
Figure 5C:
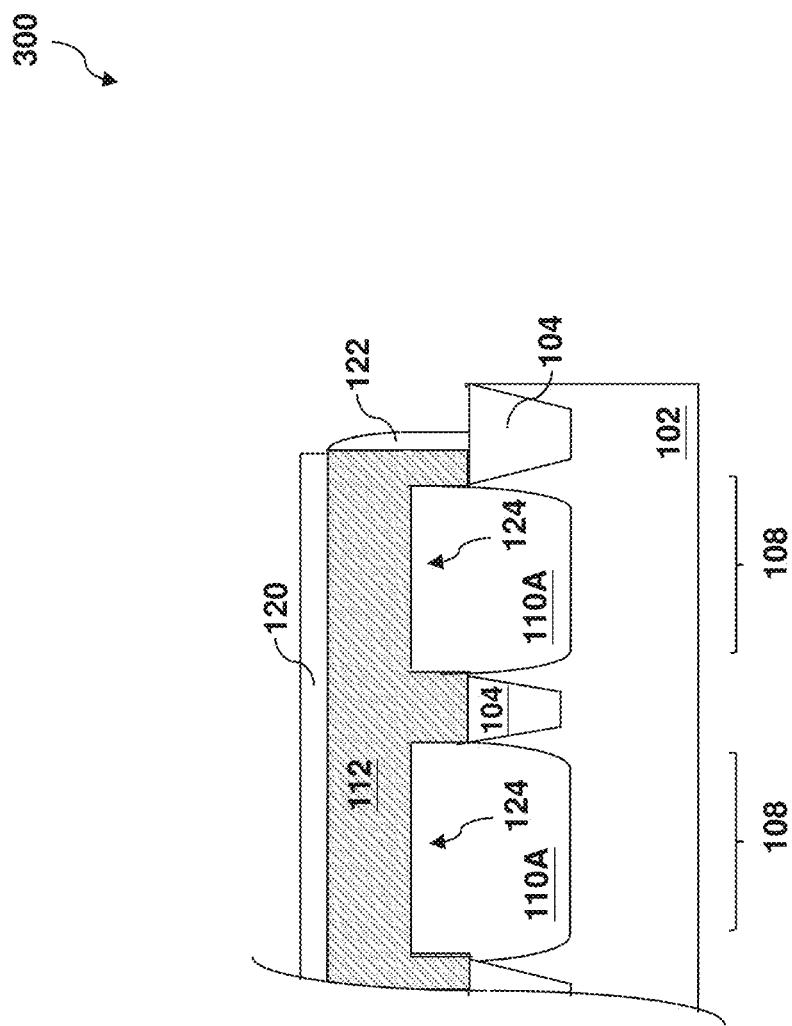
FIGS. 5C, 6C, 7C, 8C, 9C, 10C, 11C, 12C, and 13C are sectional views of the workpiece taken along the dashed line BB' at various fabrication stages of the method making the workpiece according to various aspects of the present disclosure.
Figure 5D:
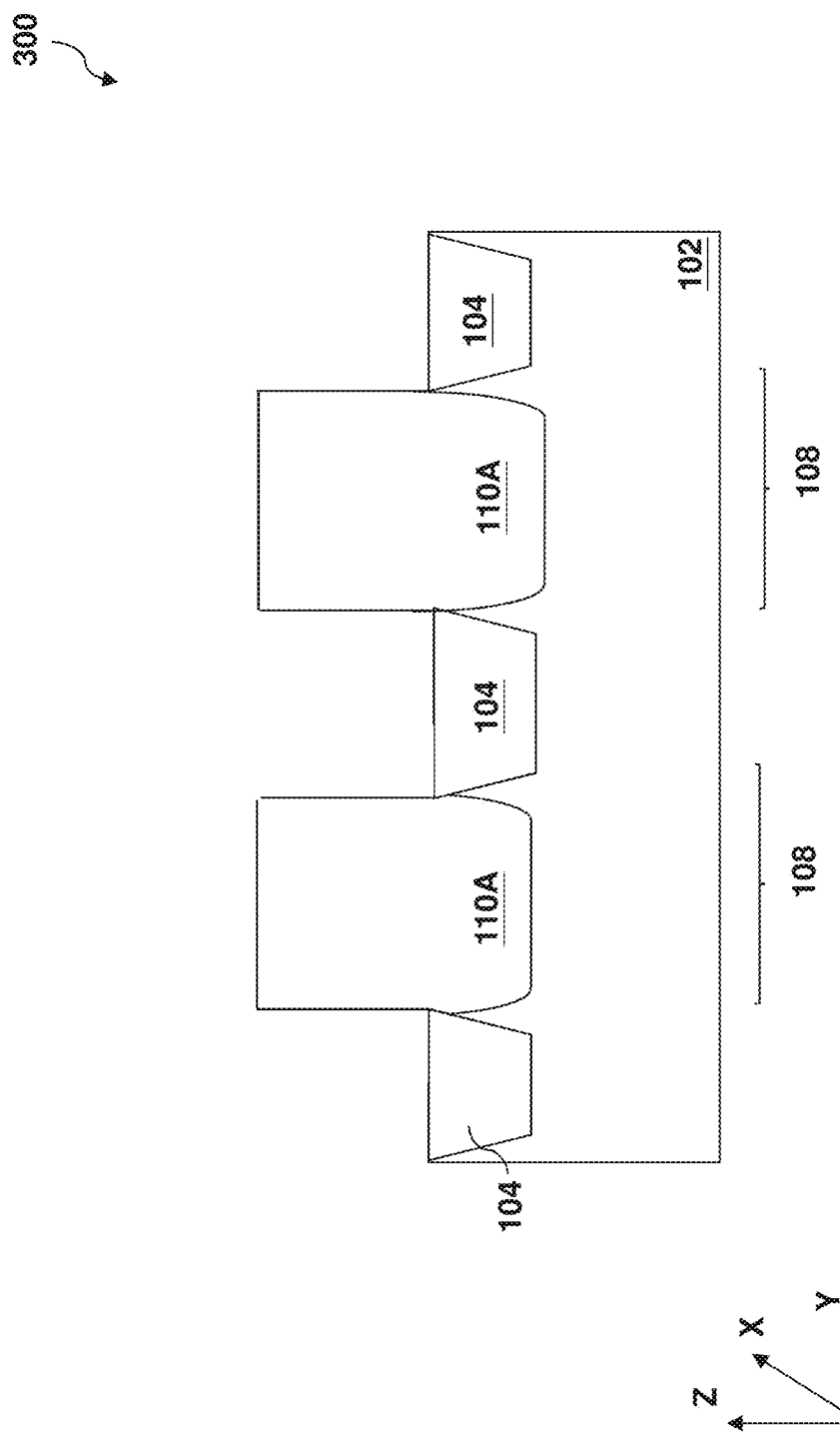
Figure 6A:
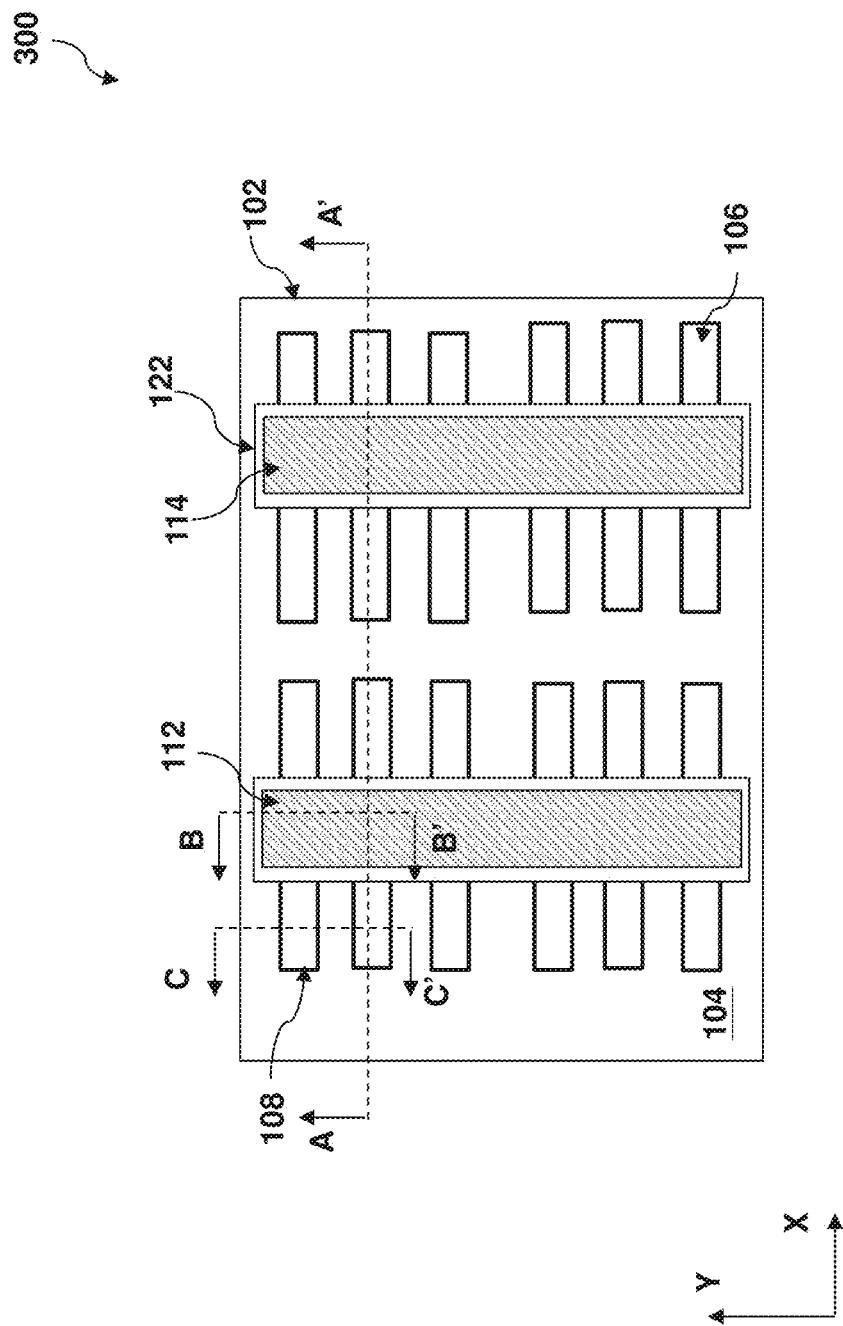
Figure 6B:
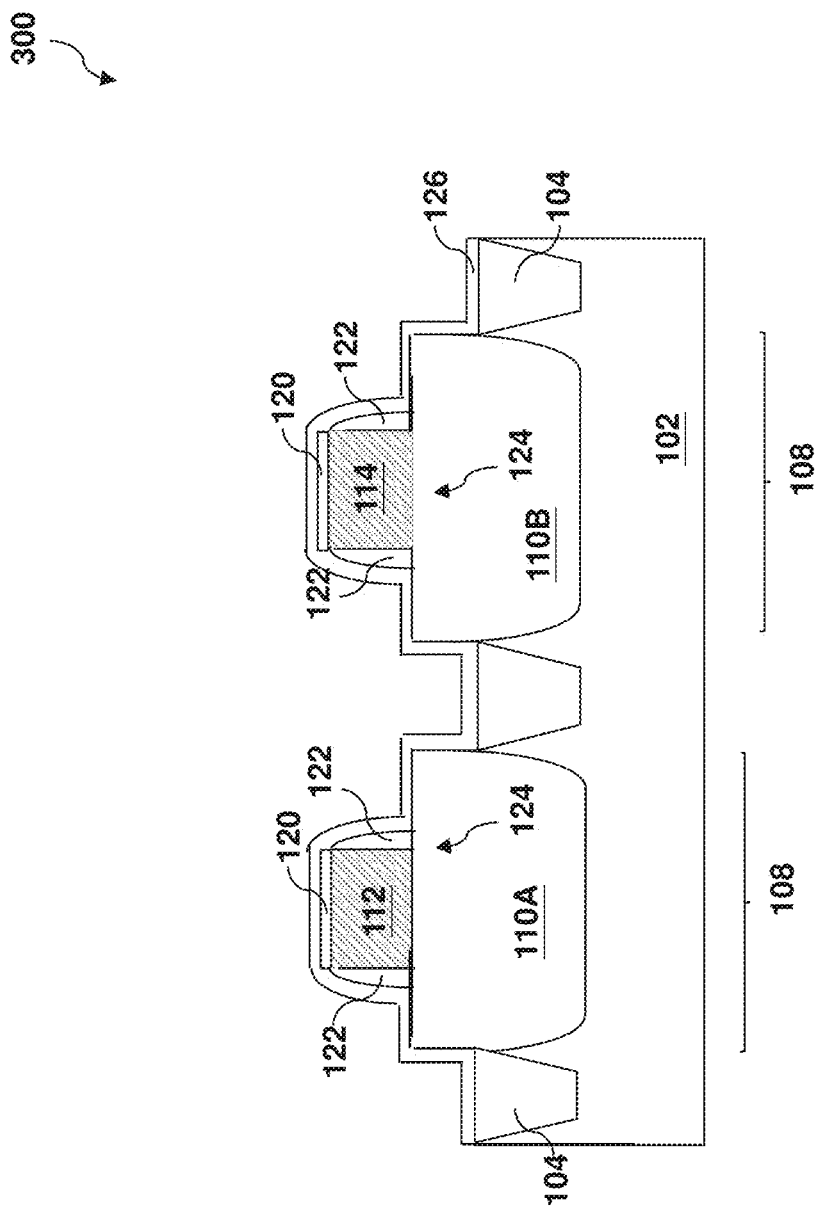
Figure 6C:
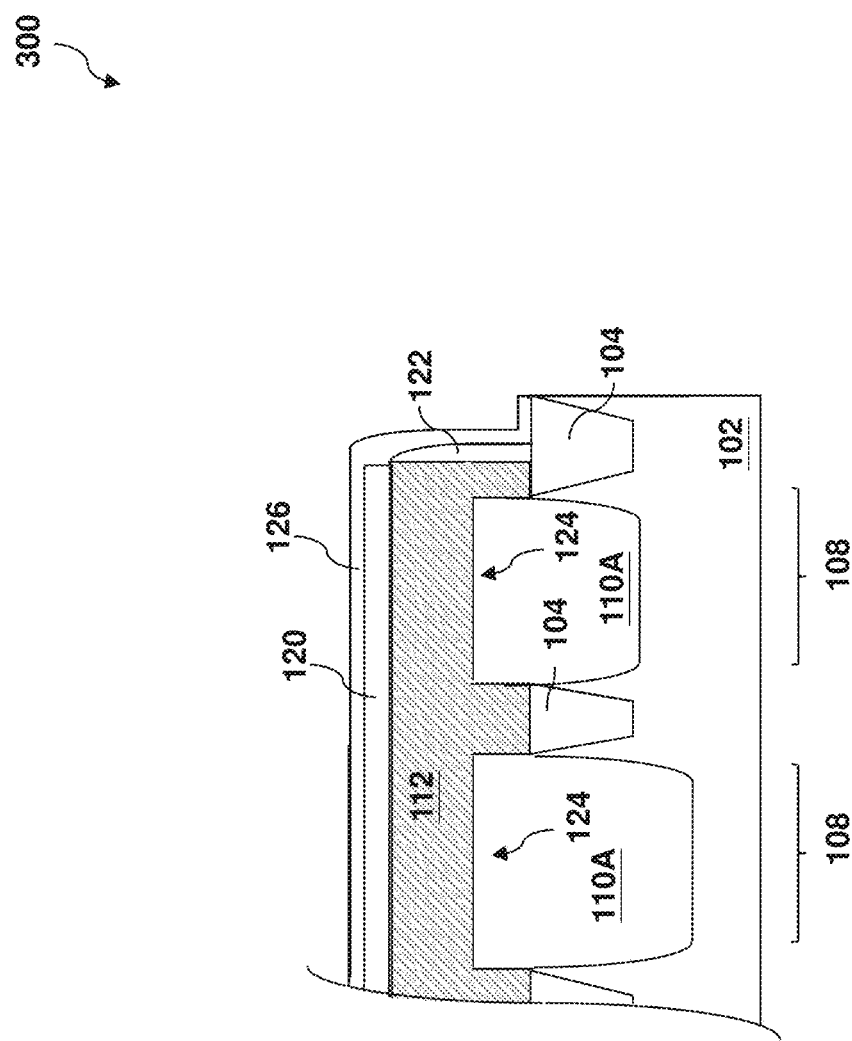

Still referring to block 208 of FIG. 1 and FIGS. 4A and 4B, the method 200 may further include an operation 208 to form one or more doped well (such as 110A and 110B) on the fin active region 108. The doped well extends through the fin active region 108 along the X direction, such as from the left isolation feature 104 to the right isolation feature 104 so that a fin active region 108 is enclosed within the corresponding doped well. The doped well is formed by ion implantation or other suitable technique. In some examples, the doped well is n-type doped for one or more p-type field effect transistor (FET) to be formed thereon. In some examples, the doped well is p-type doped for one or more n-type FET to be formed thereon. In some examples, the semiconductor structure 300 includes a p-type doped well 110A and an n-type doped well 110B as illustrated in FIG. 4B.

Referring to block 210 of FIG. 1 and FIGS. 5A-5D, the method 200 includes an operation to form one or more gate stack, such as 112 and 114 on the substrate 102. In the present embodiment, the gate stacks are dummy gate stacks and will be replaced by metal gate stacks at later stages. Each gate stack may include a gate dielectric layer (such as silicon oxide) and a gate electrode (such as polysilicon) on the gate dielectric layer on the fin active regions 108. The formation of the gate stacks includes forming various gate material layers (such as thermal oxidation to form silicon oxide and depositing polysilicon), and patterning the gate material layers using lithography process and etching. A hard mask 120 may be used to pattern the gate material layers. For example, the hard mask 120 is deposited on the gate material layers, and is patterned by lithography process and etching to have various openings. Then the pattern defined on the hard mask is transferred to the gate material layers by etching. In some examples, the hard mask 120 includes silicon nitride, silicon oxide, other suitable material, or a combination thereof. In some examples, the hard mask 120 may include multiple films, such as a silicon nitride layer and a silicon oxide layer on the silicon nitride layer.

To pattern the hard mask 120, the operation 210 may include a variety of processes such as photolithography and etching. The photolithography process may include forming a photoresist (not shown) over the substrate 102. An exemplary photoresist includes a photosensitive material sensitive to radiation such as UV light, deep ultraviolet (DUV) radiation, and/or EUV radiation. A lithographic exposure is performed on the workpiece 300 that exposes selected regions of the photoresist to radiation. The exposure causes a chemical reaction to occur in the exposed regions of the photoresist. After exposure, a developer is applied to the photoresist. The developer dissolves or otherwise removes either the exposed regions in the case of a positive resist development process or the unexposed regions in the case of a negative resist development process. Suitable positive developers may include TMAH (tetramethyl ammonium hydroxide), KOH, and NaOH, and suitable negative developers may include solvents such as n-butyl acetate, ethanol, hexane, benzene, and toluene. After the photoresist is developed, the exposed portions of the hard mask 120 may be removed by an etching process, such as wet etching, dry etching, Reactive Ion Etching (RIE), ashing, and/or other etching methods, resulting in a patterned hard mask 120. After etching, the photoresist may be removed by wet stripping or plasma ashing.

In some embodiments, gate spacer 122 may be formed on sidewalls of the gate stacks. The gate spacer 122 includes one or more dielectric material, such as silicon oxide, silicon nitride, silicon oxynitride, other suitable dielectric material or a combination thereof. The spacer 122 may have a multilayer structure and may be formed by depositing dielectric material and then anisotropic etching, such as plasma etching. In some embodiments, gate spacers 122 may be used to offset the subsequently formed source/drain features and may be used for designing or modifying the source/drain profile.

The dummy gate stacks are formed over channel regions 124 over the fins 108, wherein the channel regions 124 may be portions of the corresponding FETs. The formation of the metal gate stacks may include a gate-last process, a high-k-last process, or other suitable procedure, which will be described at later stage.

Referring to block 212 of FIG. 1 and to FIGS. 6A-6D, the method 200 proceeds to an operation to form a dielectric layer 126 on the workpiece 300. The dielectric layer 126 may be deposited by suitable method, such as CVD or other proper technique. The dielectric layer 126 may provide proper functions, such as etching stop/protection, during the fabrication process. The dielectric layer 126 may include multiple films. In the present embodiment, the dielectric layer 126 includes a silicon oxynitride film, a silicon nitride film on the silicon oxynitride film, and a low-k dielectric film on the silicon nitride film. Each film may be deposited by CVD with proper thicknesses.

The method 200 proceeds to a block 214 to form epitaxial source and drain features. The operation 214 is further described in detail with reference to FIG. 2.

Figure 7A:
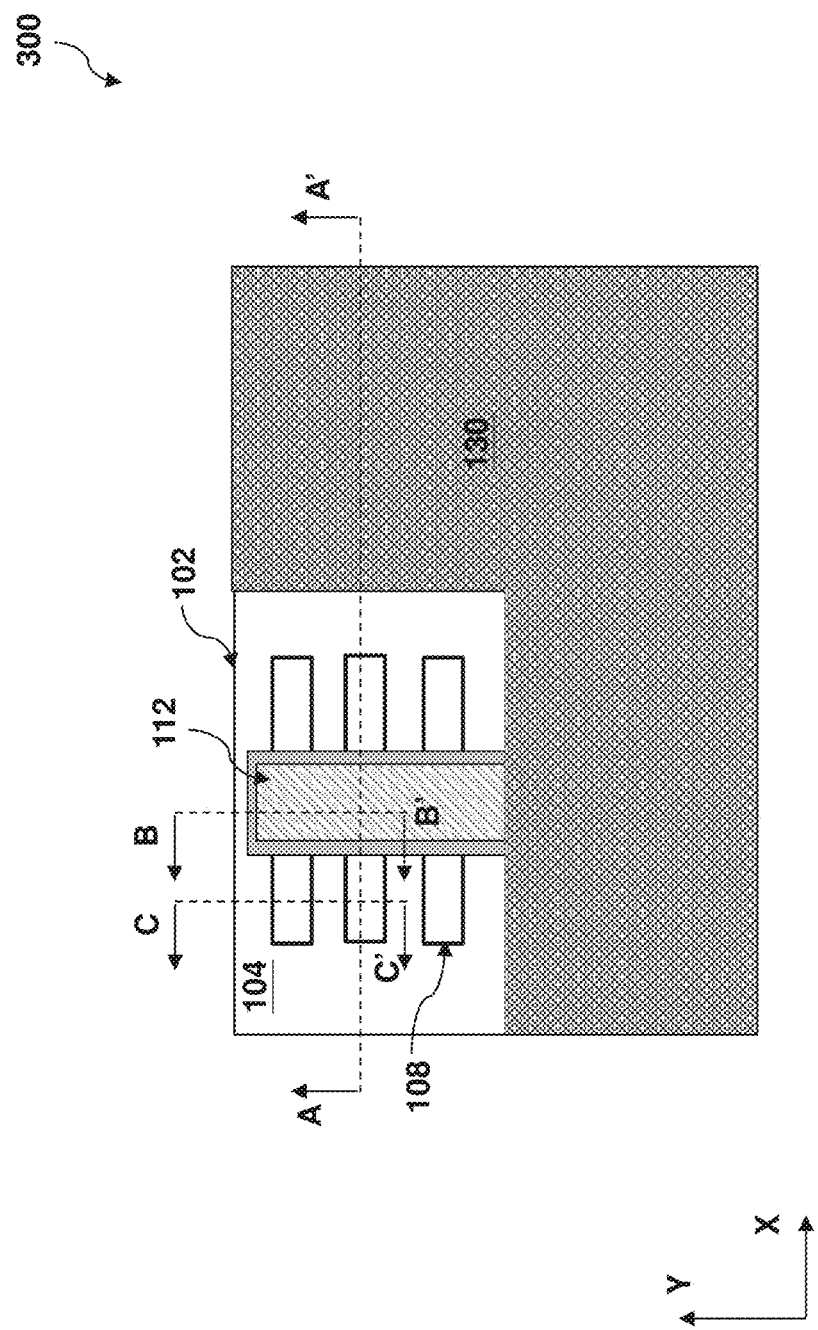
Figure 7B:
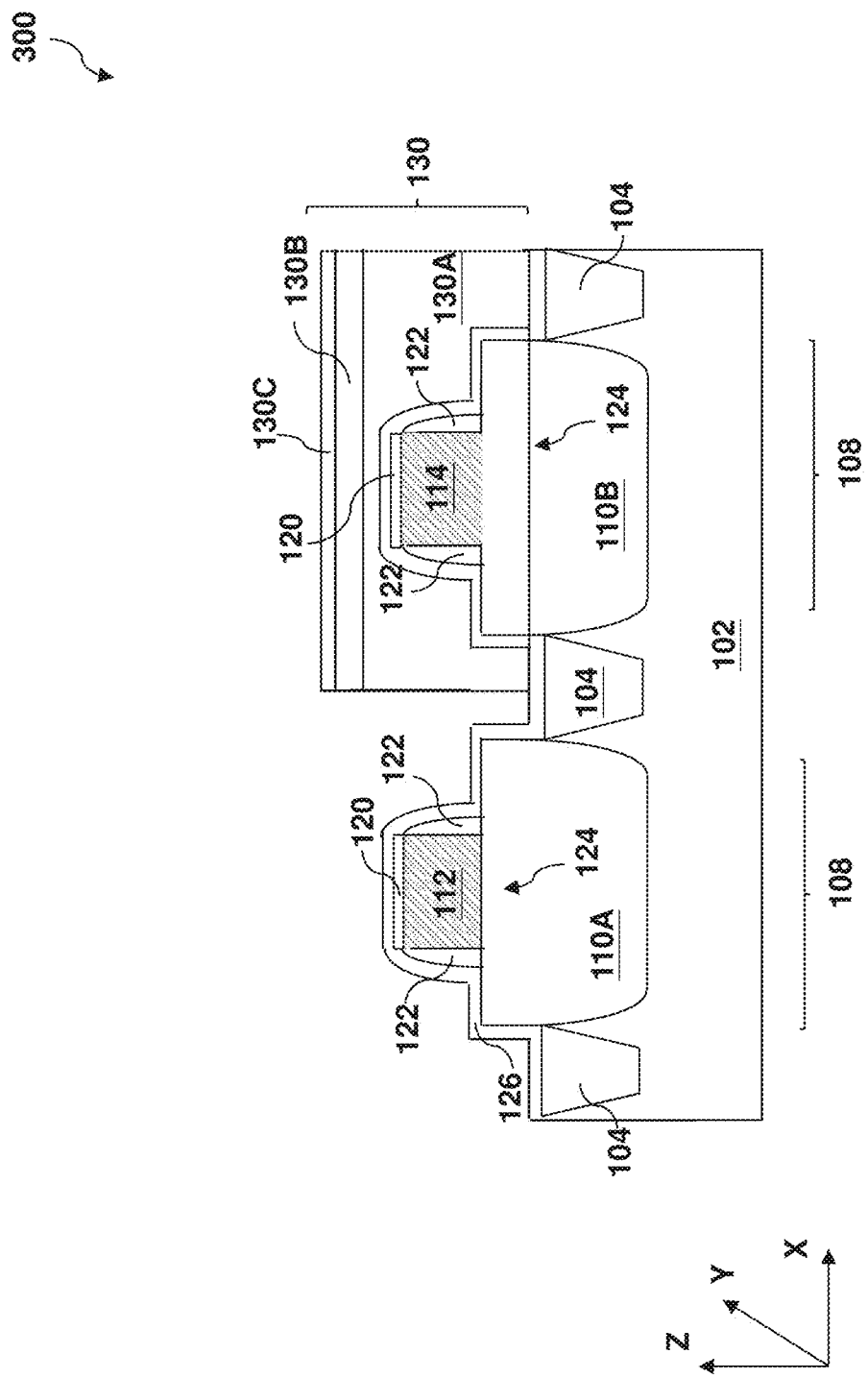
Figure 7C:
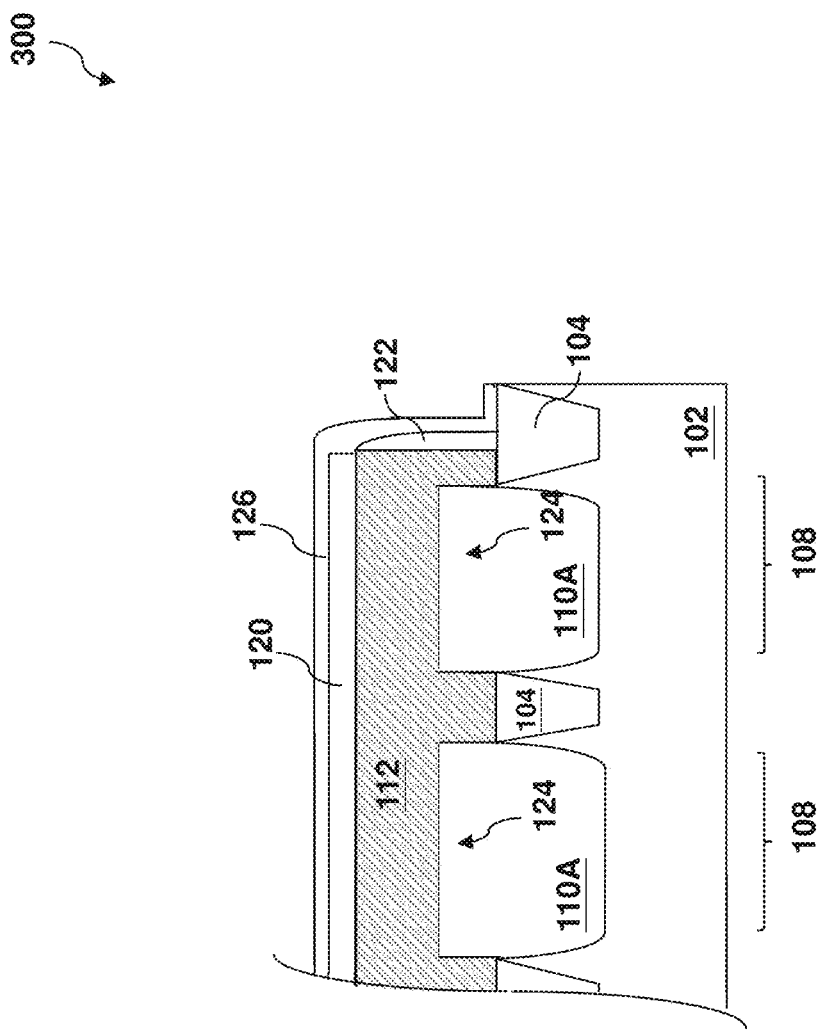
Figure 8A:
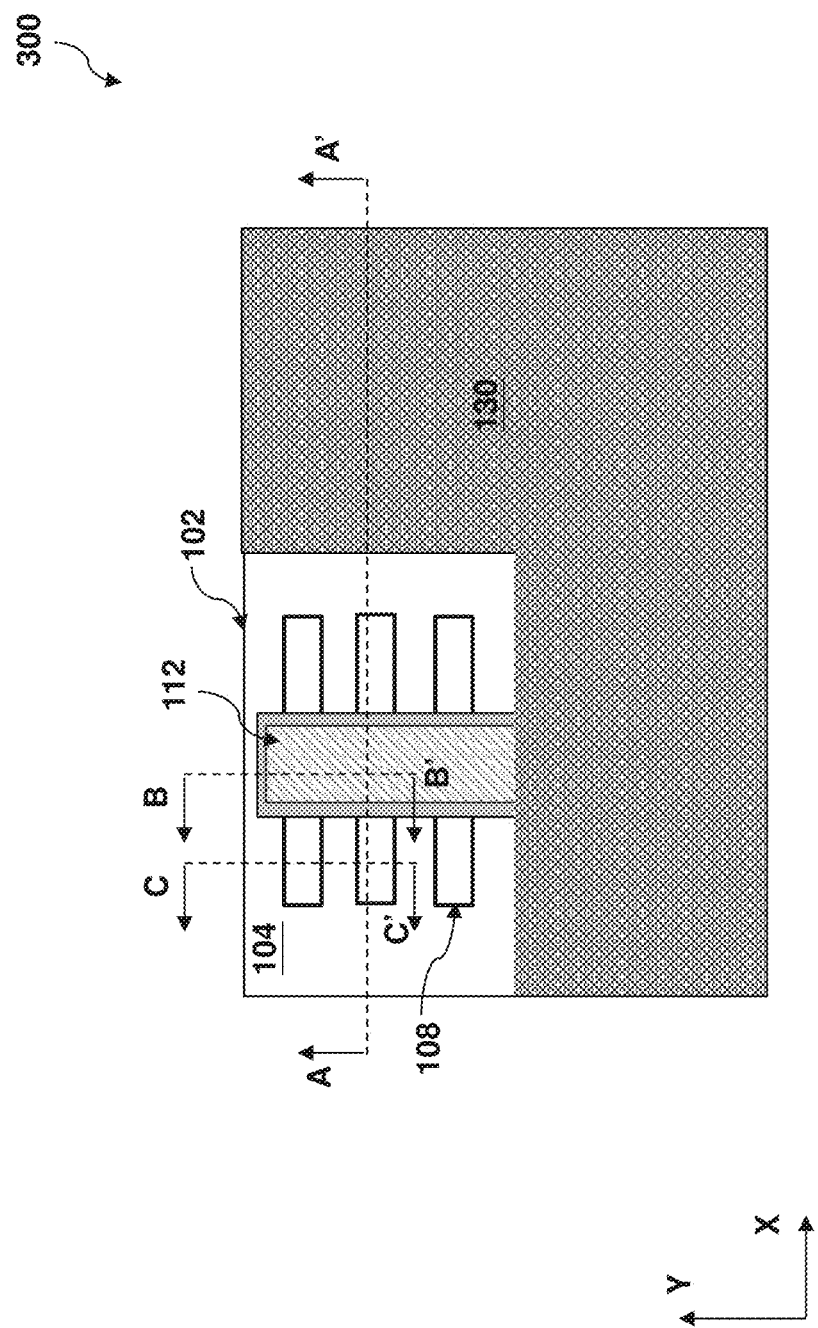
Figure 8B:
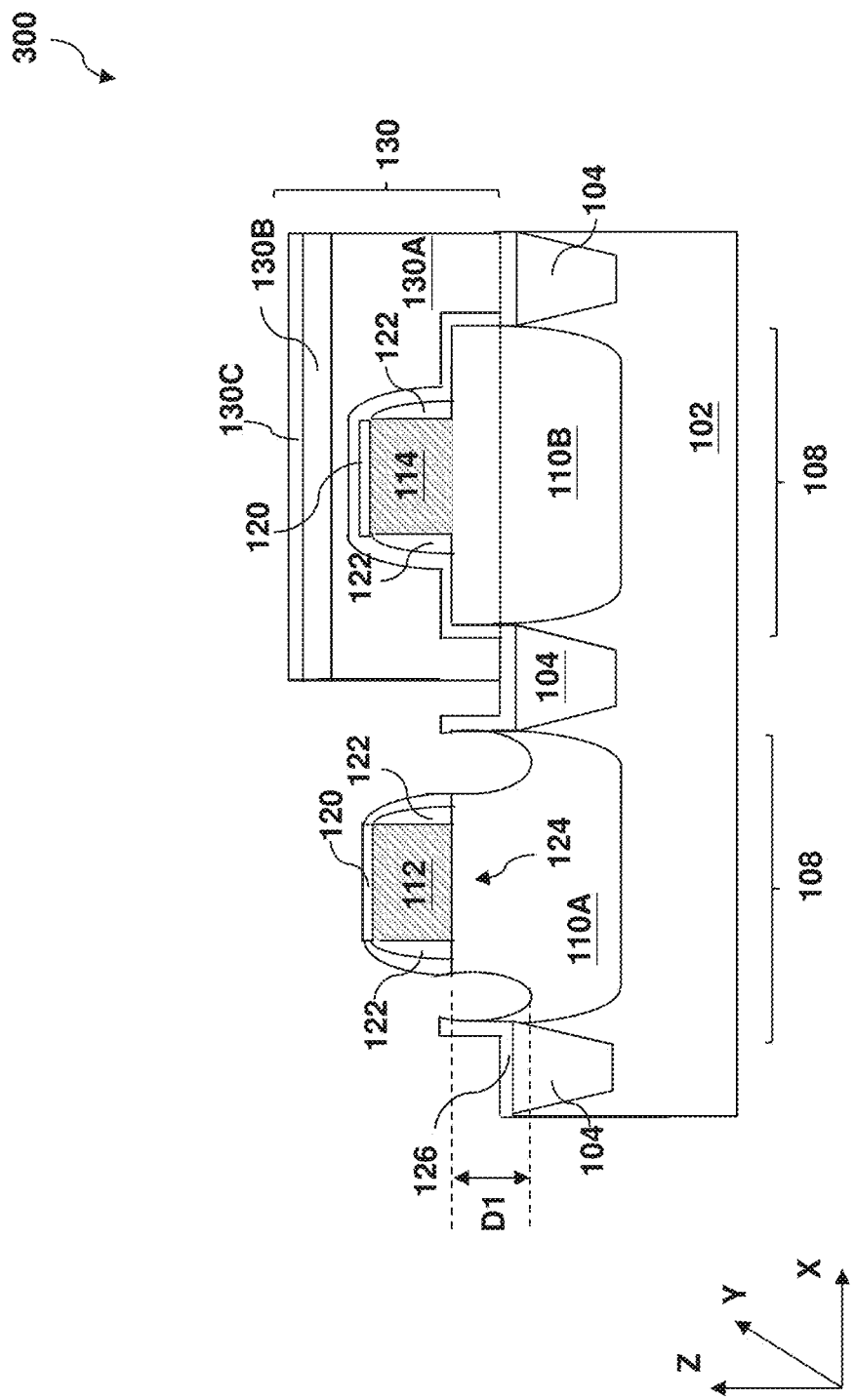
Figure 8C:
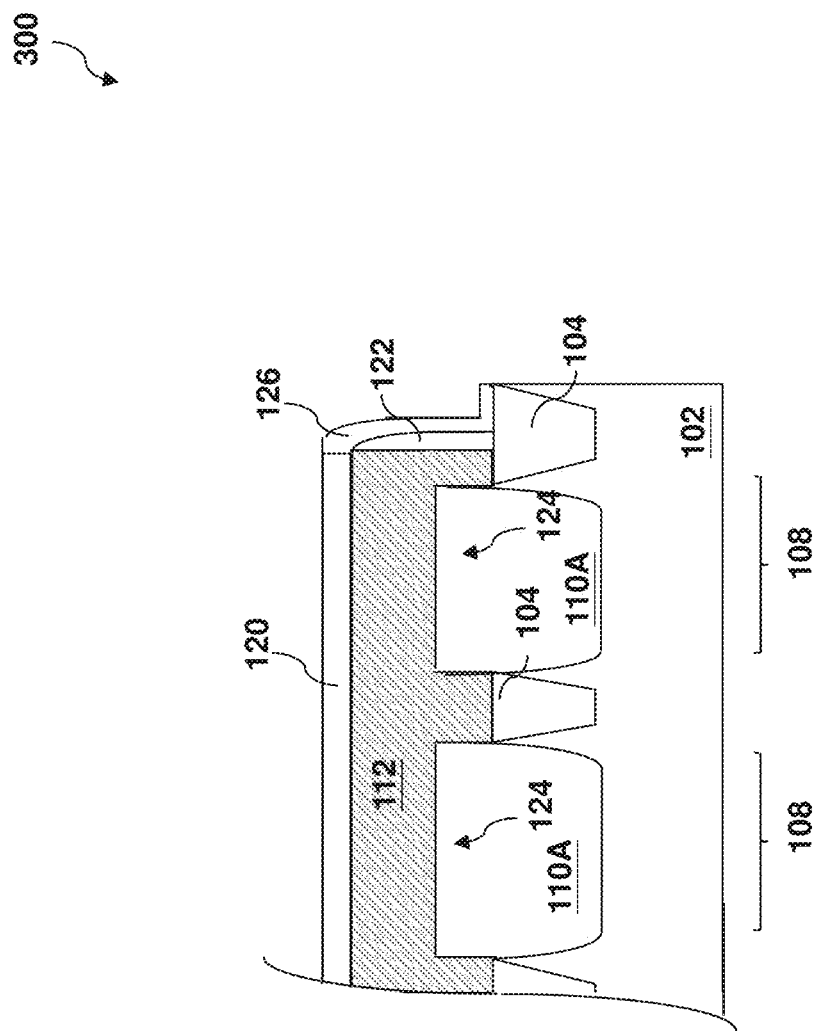
Figure 9A:
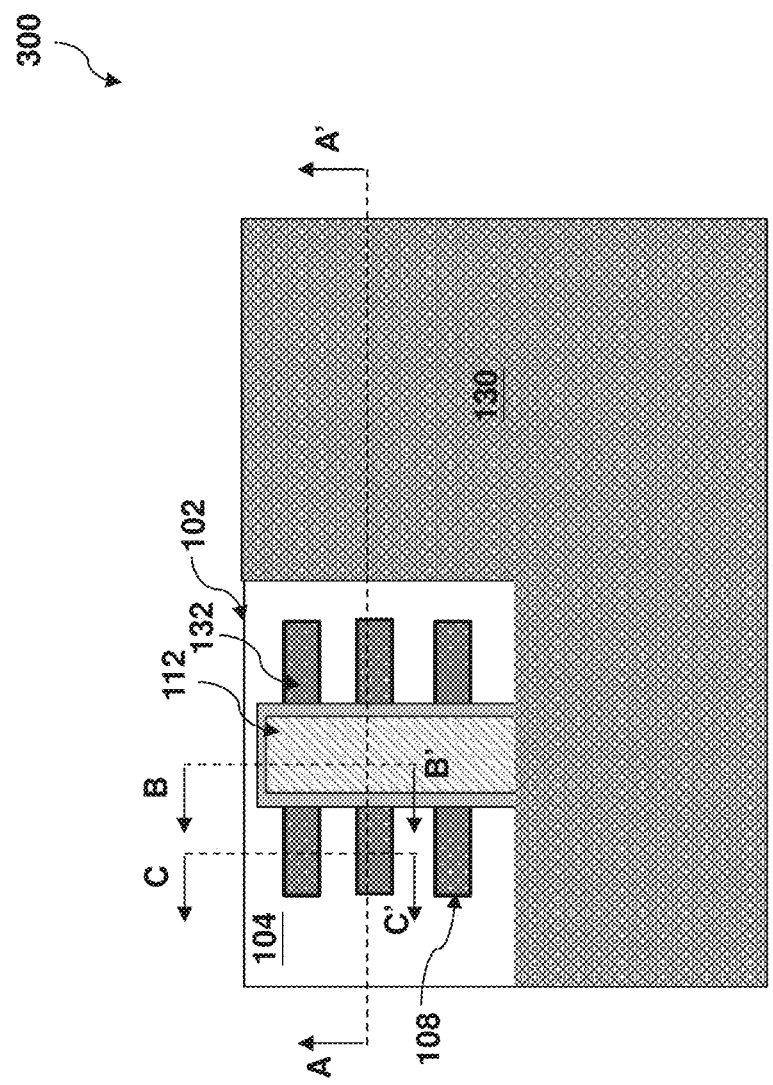
Figure 9B:
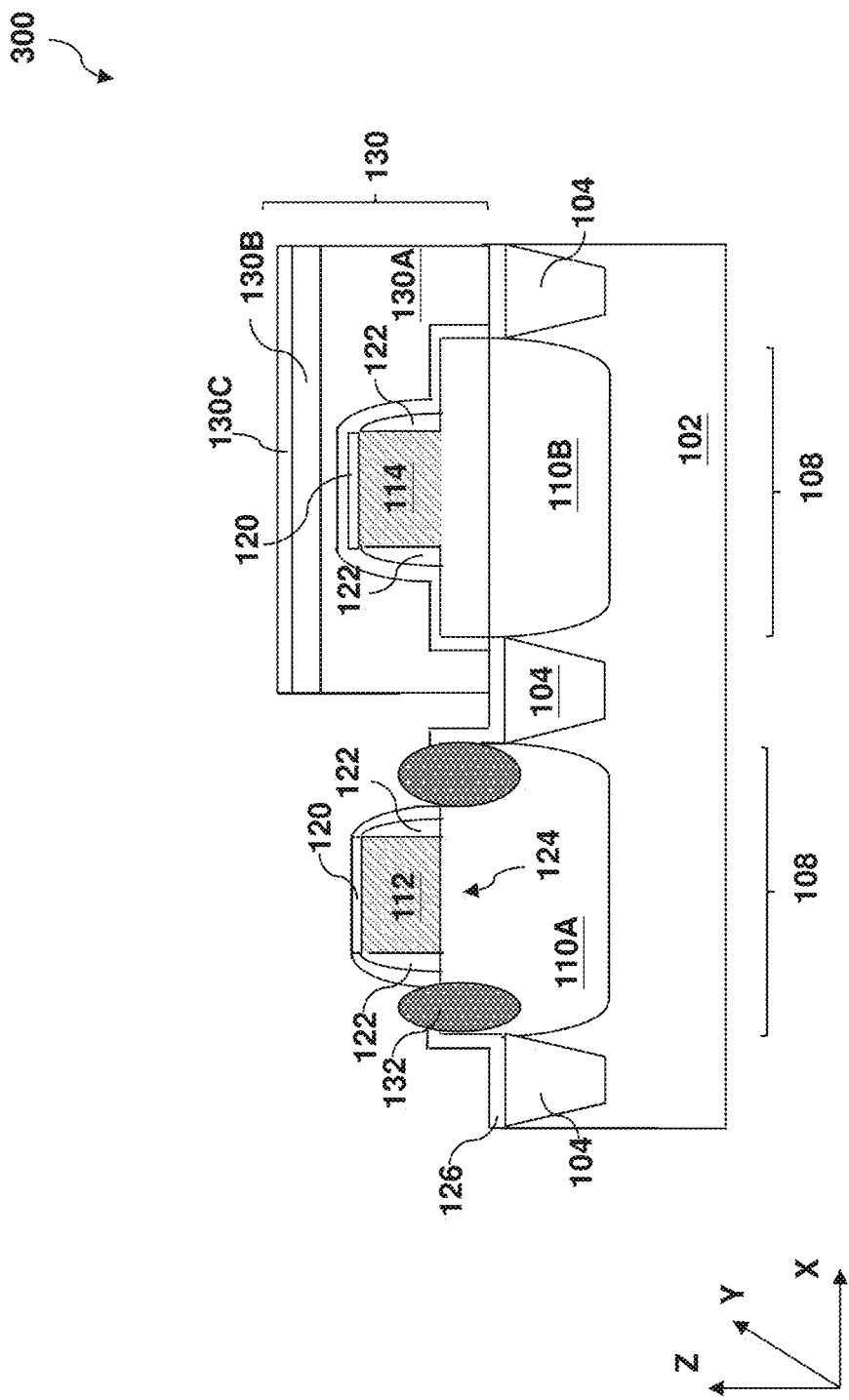
Figure 9C:
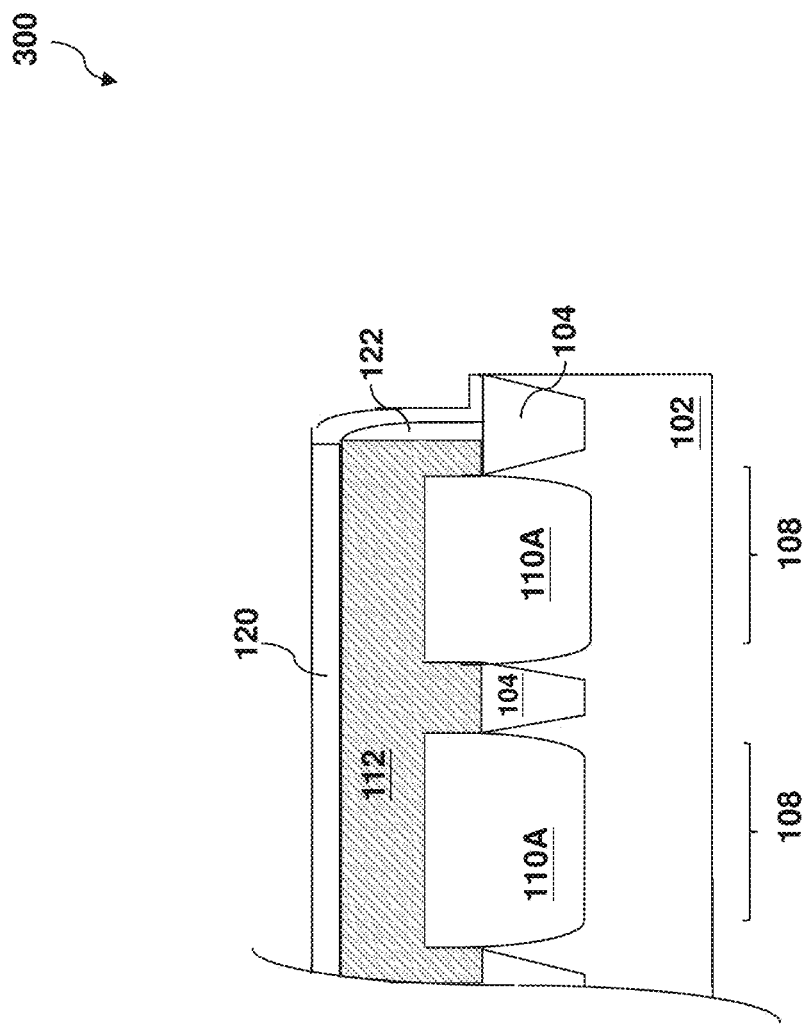
Figure 9D:
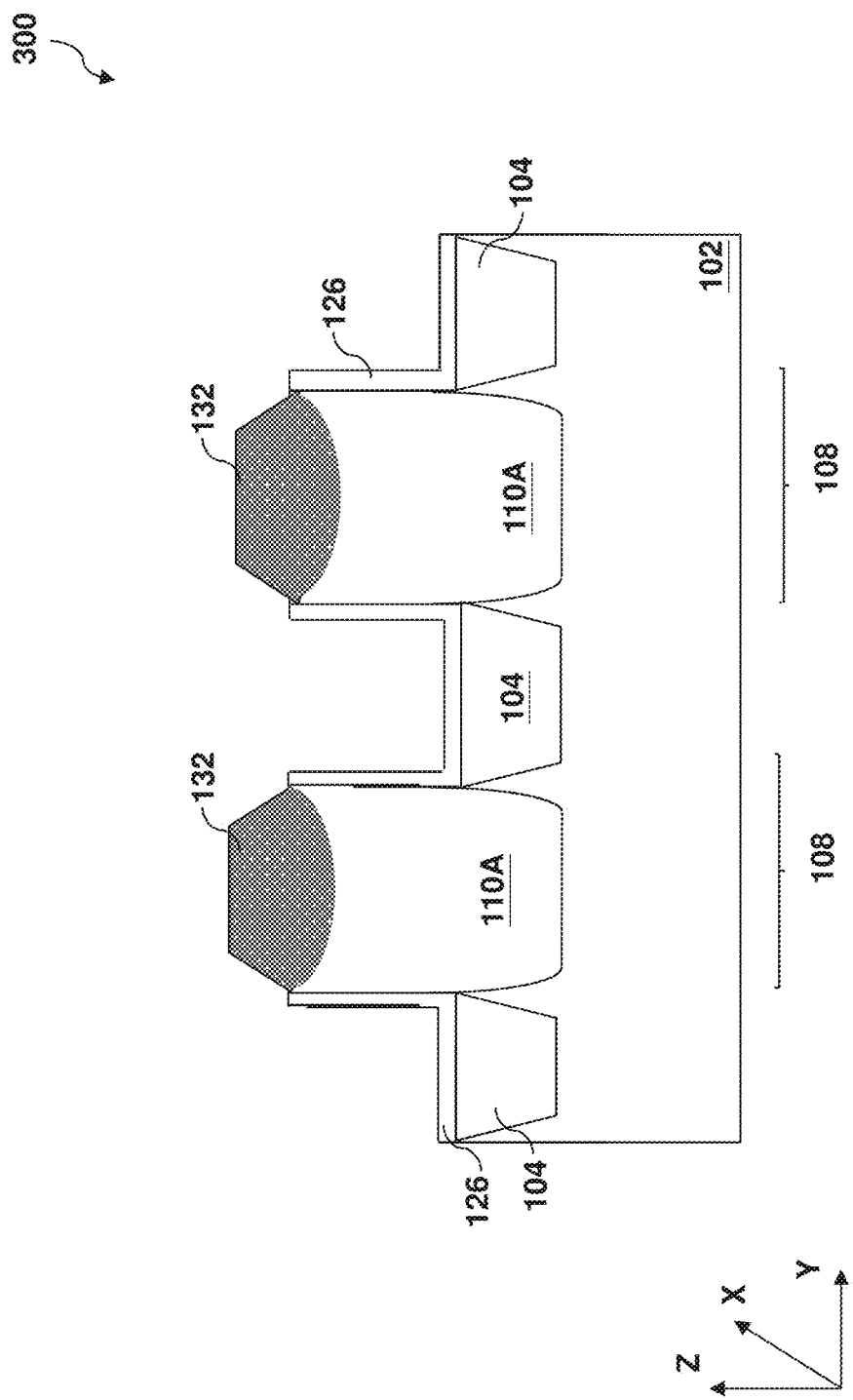

Referring to block 222 of FIG. 2 and to FIGS. 7A-7D, the method 200 proceeds to an operation to form a patterned photoresist layer 130 with an opening to expose first source/drain regions within a first area of the workpiece 300. A source/drain region refers to an area of a fin active region for the corresponding source/drain feature to be formed thereon. In some embodiment, the first area includes various devices to be formed, such as logic devices. The patterned photoresist layer 130 is formed by lithography process with an opening defining the first area, as illustrated in FIG. 7A. In the present embodiment, the photoresist layer 130 is a tri-layer photoresist that includes a bottom layer 130A, a middle layer 130B and photosensitive layer 130C to enhance lithography process with high resolution and etch resistance, as illustrated in FIG. 7B.

Referring to block 224 of FIG. 2 and to FIGS. 8A-8D, the method 200 proceeds to an operation to perform a dry etching process to first source/drain regions within the first area of the workpiece 300. The dry etching process may include one or more etching step that opens the dielectric layer 126 and recesses the source/drain regions in the first area. Especially, the dry etching process recesses the first source/drain regions to form trenches with a first depth $D_1$, such as in a range from 55 nm to 65 nm. In some examples, the dry etching process includes applying an etchant containing carbon oxide and hydrofluoric carbide.

Referring to block 226 of FIG. 2 and to FIGS. 9A-9D, an epitaxial process is performed to form first source/drain features 132 on the substrate 102 in the first area. During the epitaxial process, the dummy gate stacks and/or the patterned photoresist layer 130 limit the source/drain features 132 to the source/drain regions in the first area. Suitable epitaxial processes include CVD deposition techniques (e.g., vapor-phase epitaxy (VPE) and/or ultra-high vacuum CVD (UHV-CVD)), molecular beam epitaxy, and/or other suitable processes. The epitaxial process may use gaseous and/or liquid precursors, which interact with the composition of the substrate 102. The source/drain features 132 may be in-situ doped during the epitaxial process by introducing doping species including: p-type dopants, such as boron or $BF_2$; n-type dopants, such as phosphorus or arsenic; and/or other suitable dopants including combinations thereof. If the source/drain features 132 are not in-situ doped, an implantation process (i.e., a junction implant process) is performed to dope the source/drain features 132. In an exemplary embodiment, the source/drain features 132 in an NMOS device include SiP, while those in a PMOS device include GeSnB (tin may be used to tune the lattice constant) and/or SiGeSnB. One or more annealing processes may be performed to activate the source/drain features 132. Suitable annealing processes include rapid thermal annealing (RTA) and/or laser annealing processes. After the formation of the first source/drain features 132, the patterned photoresist layer 130 is removed by proper techniques.

Figure 10A:
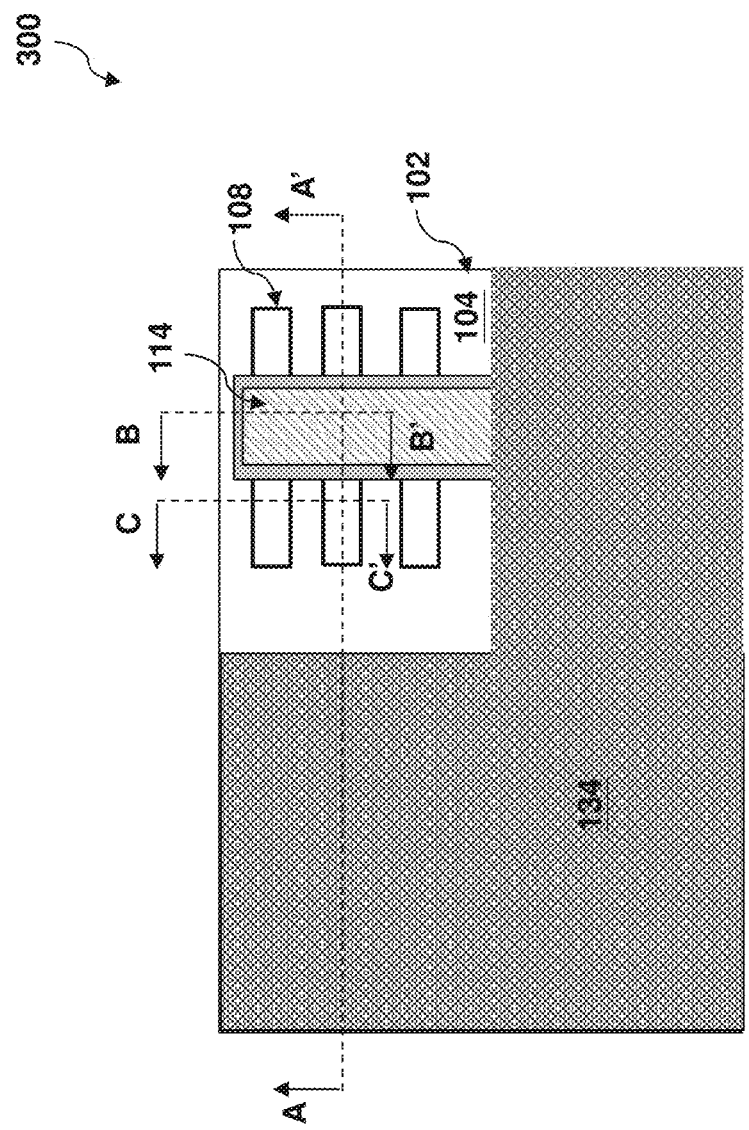
Figure 10B:
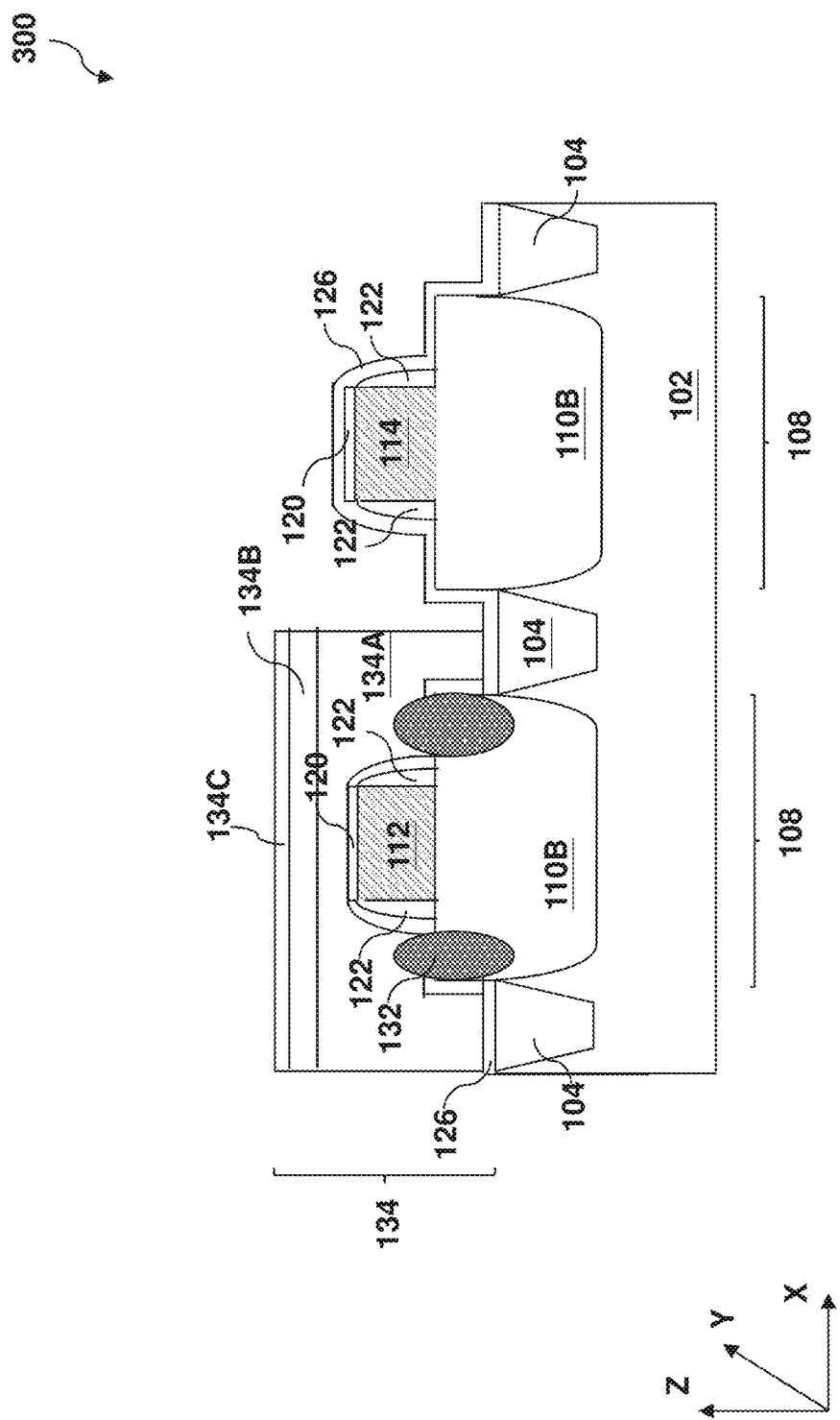
Figure 10C:
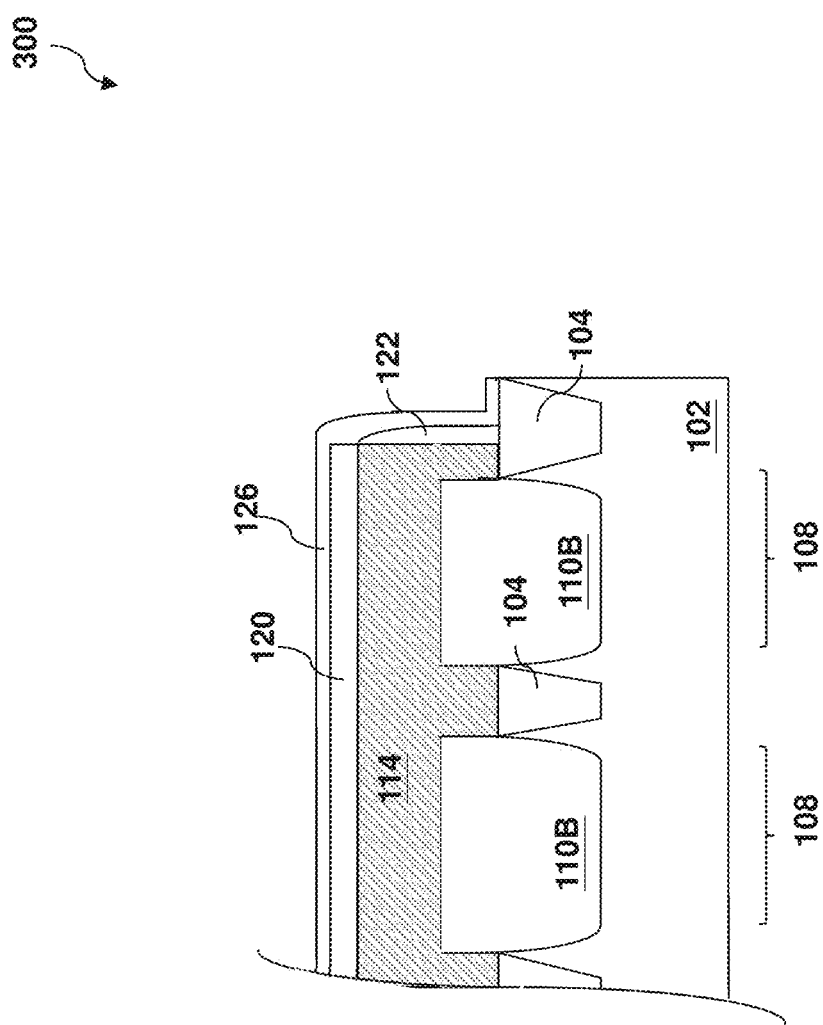
Figure 10D:
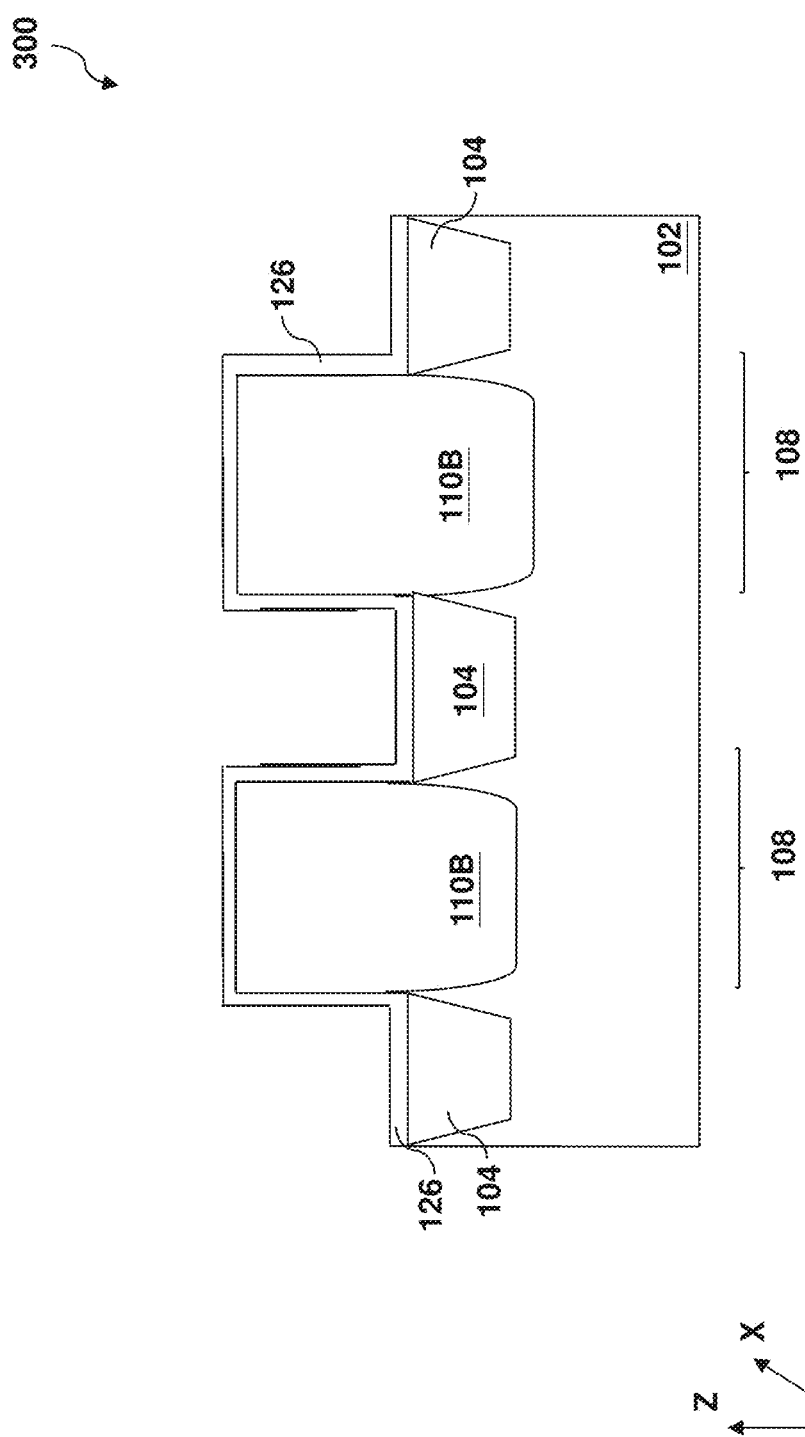
Figure 11A:
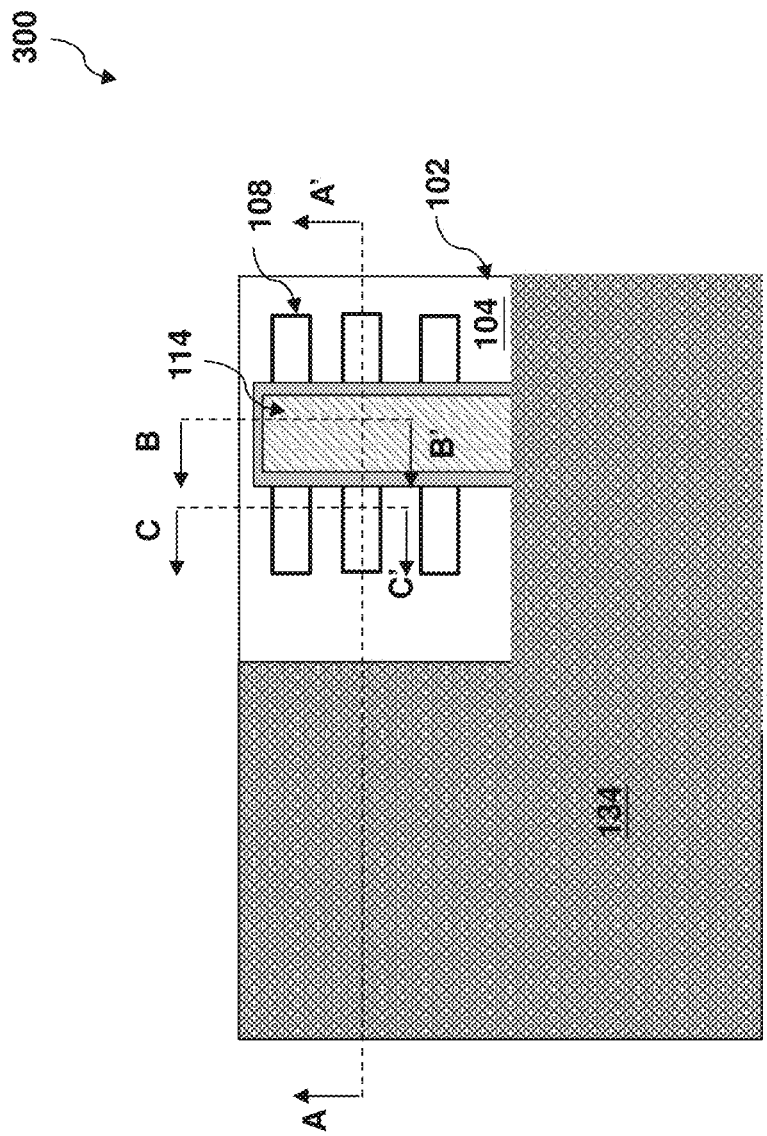
Figure 11B:
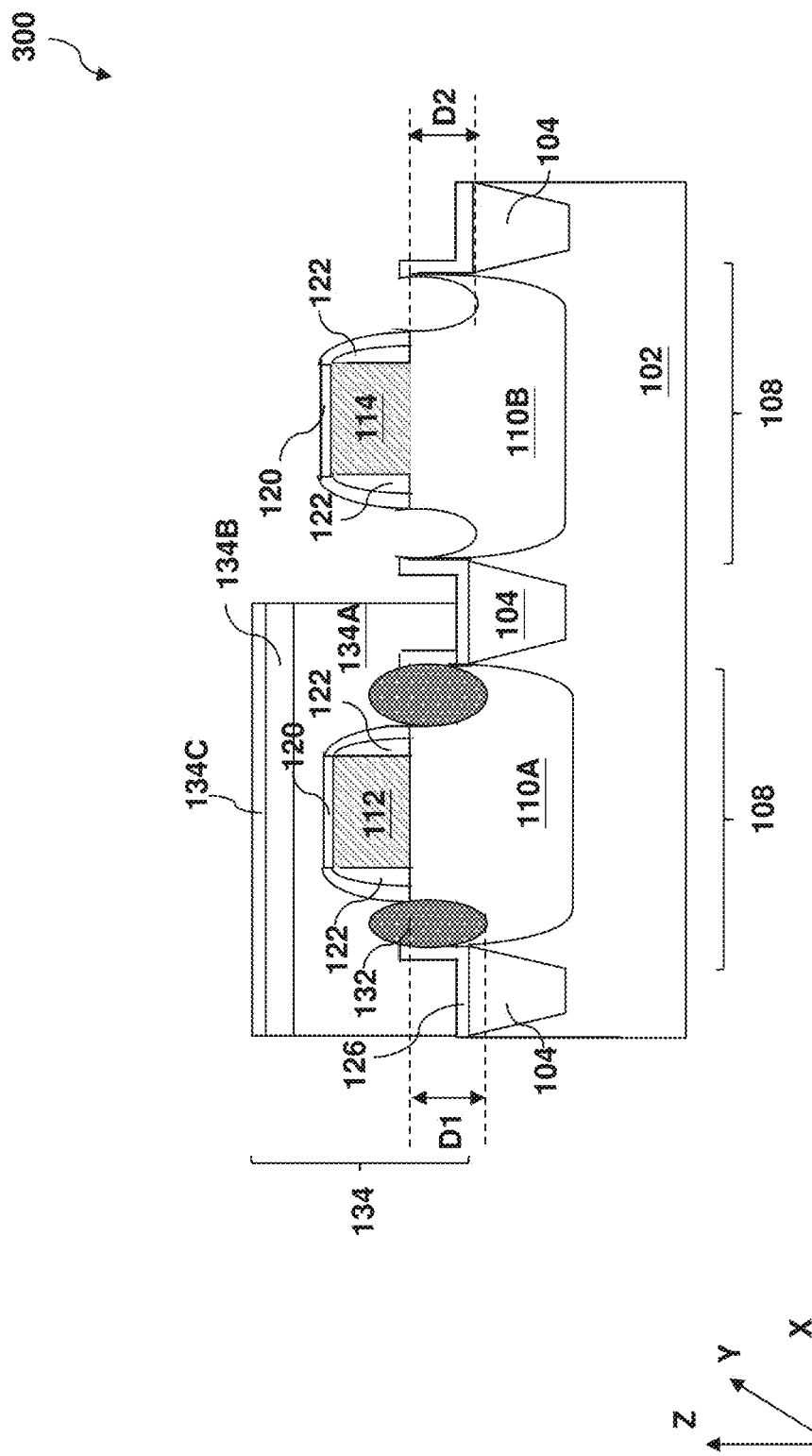
Figure 11C:
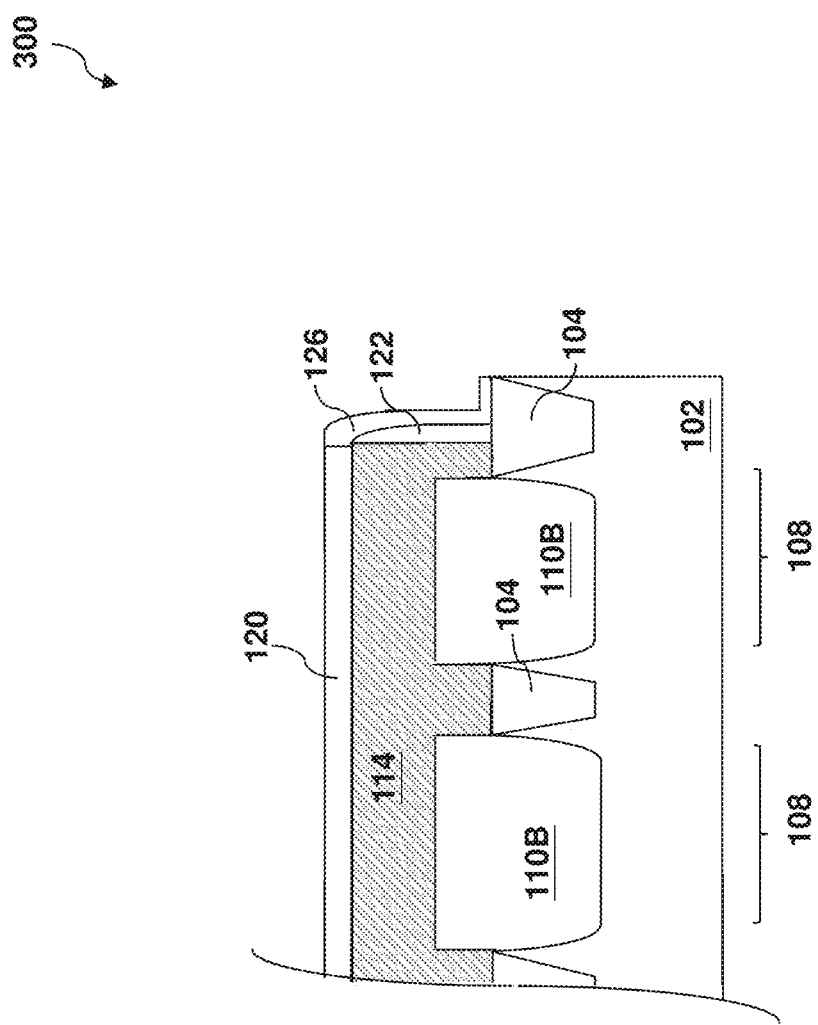
Figure 11D:
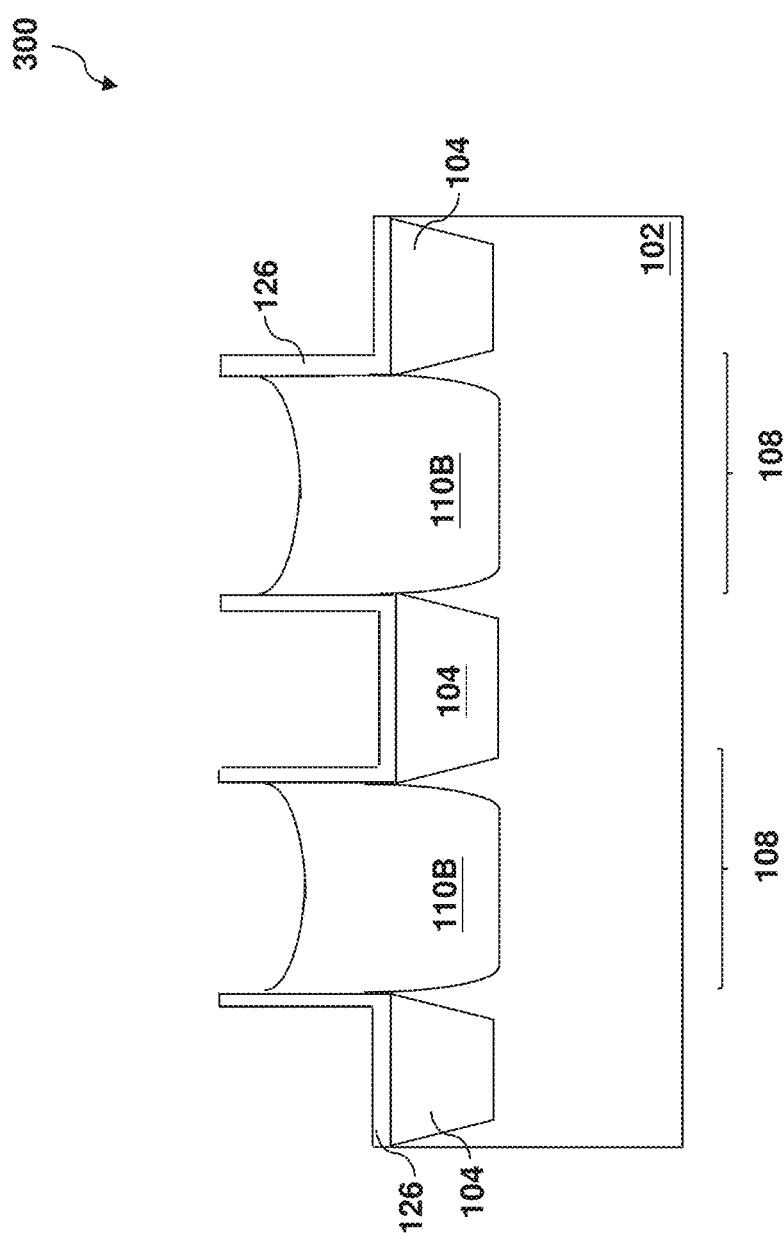
Figure 12A:
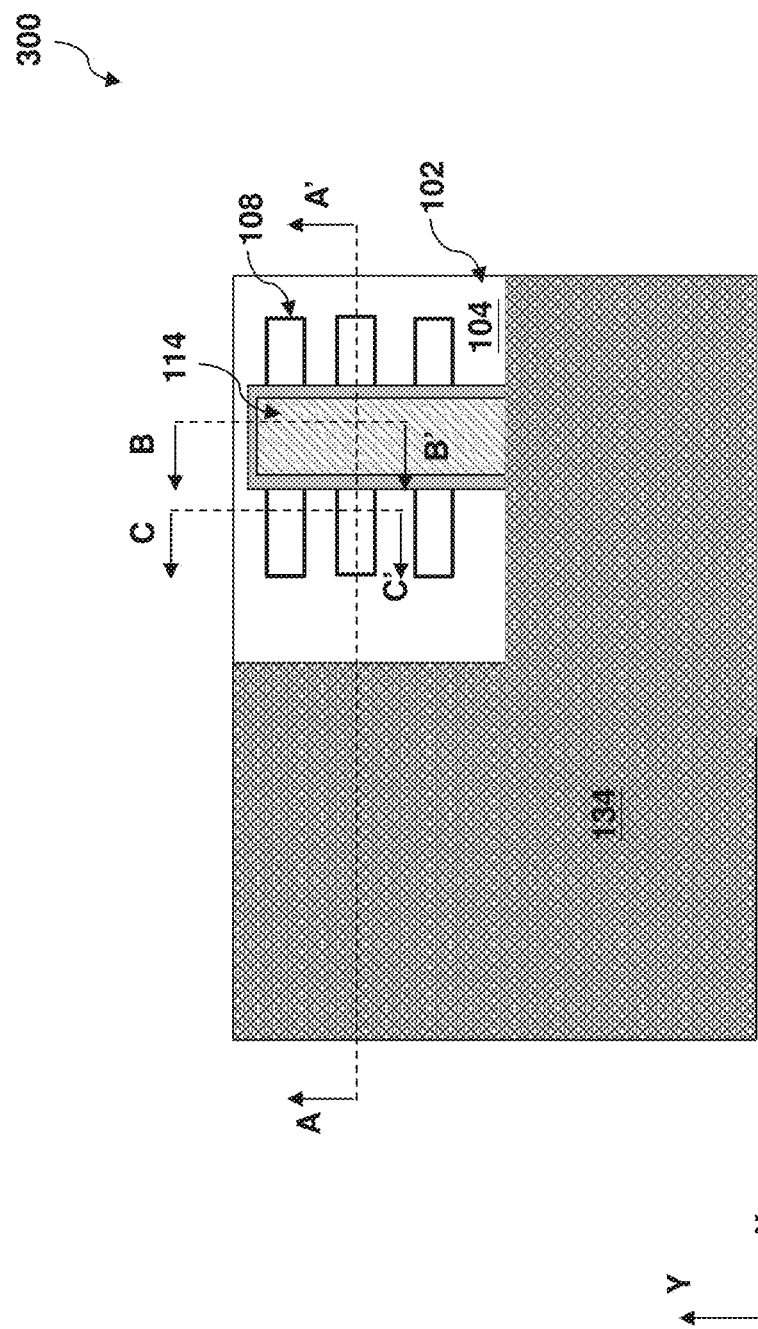
Figure 12B:
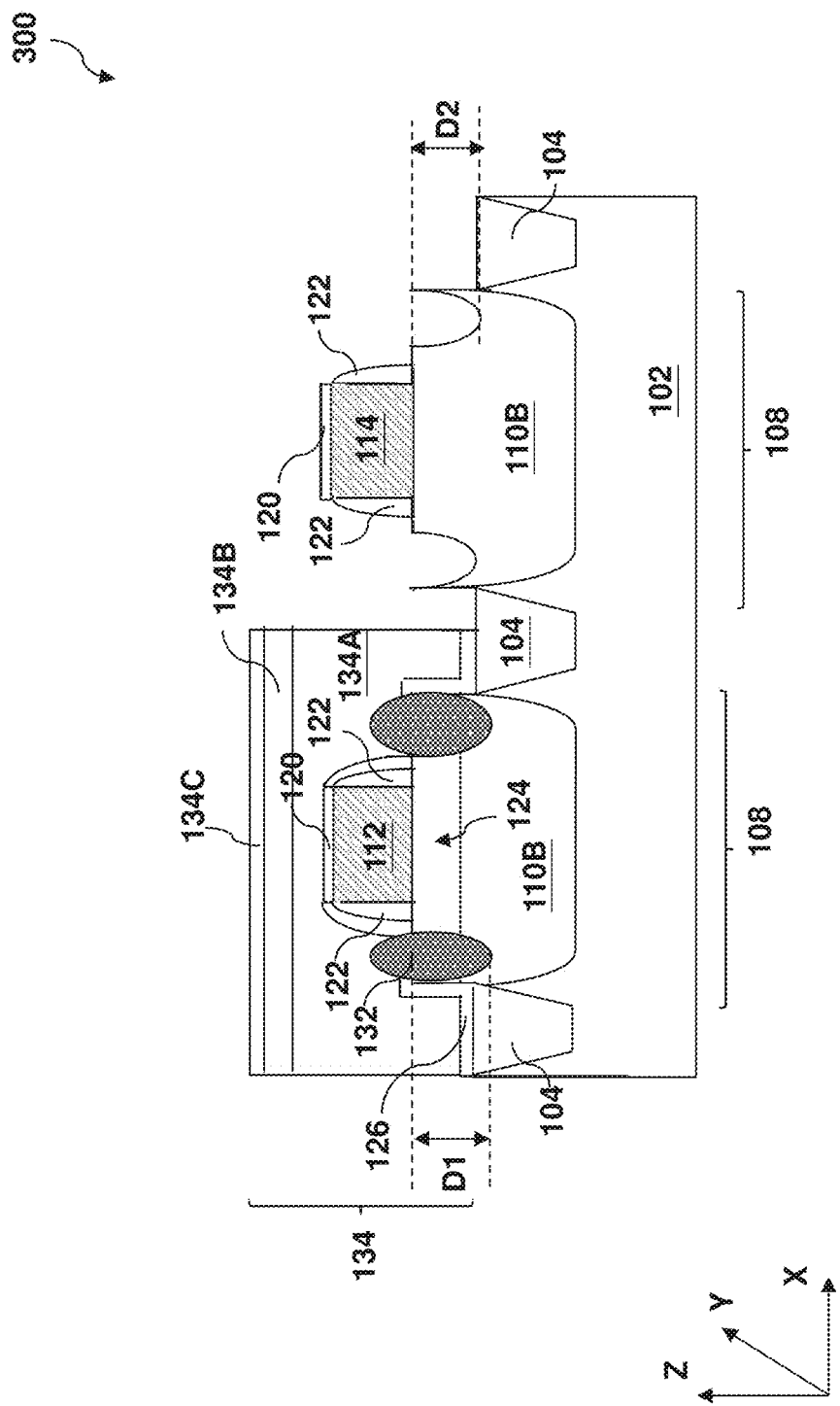
Figure 12C:
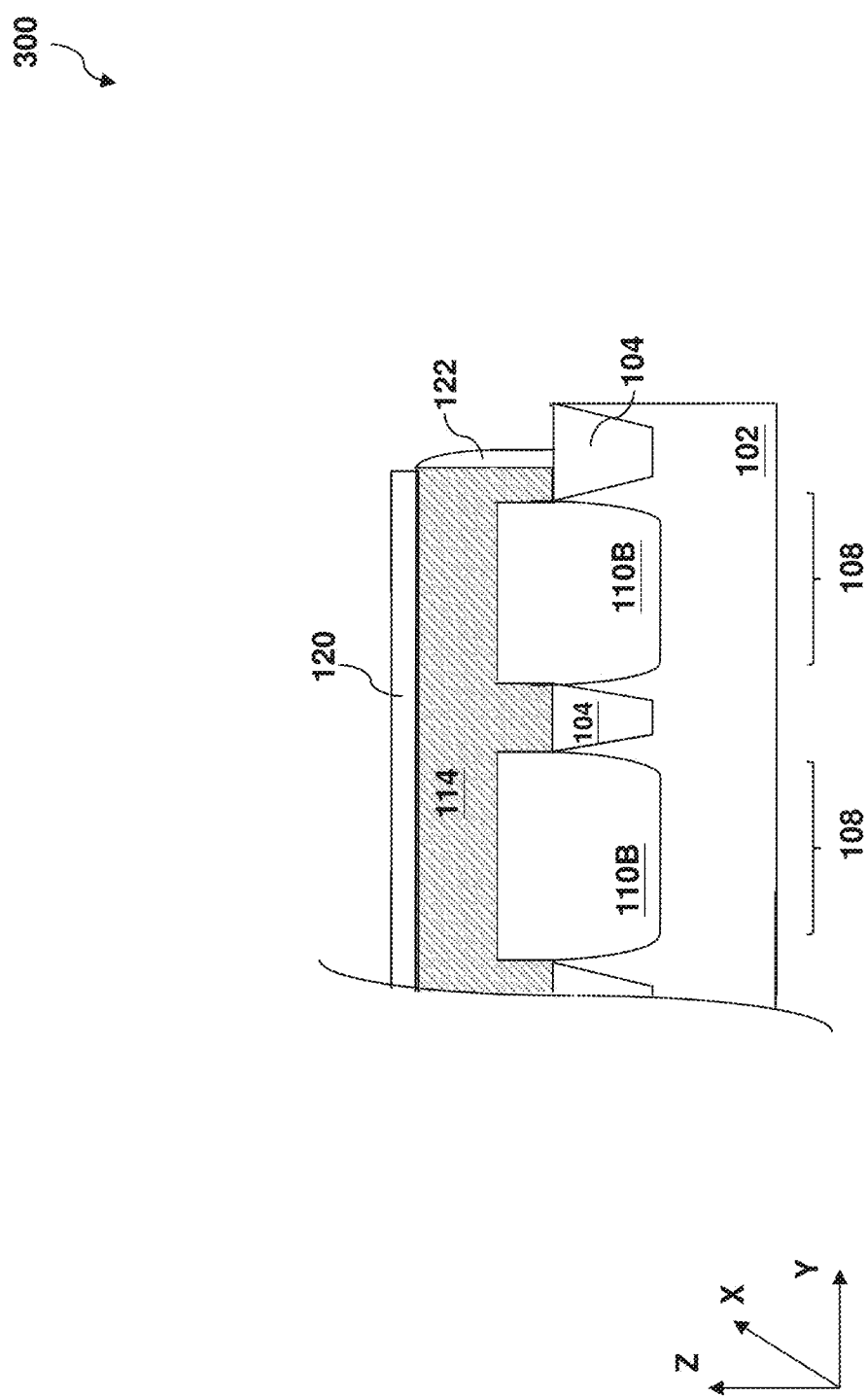
Figure 12D:
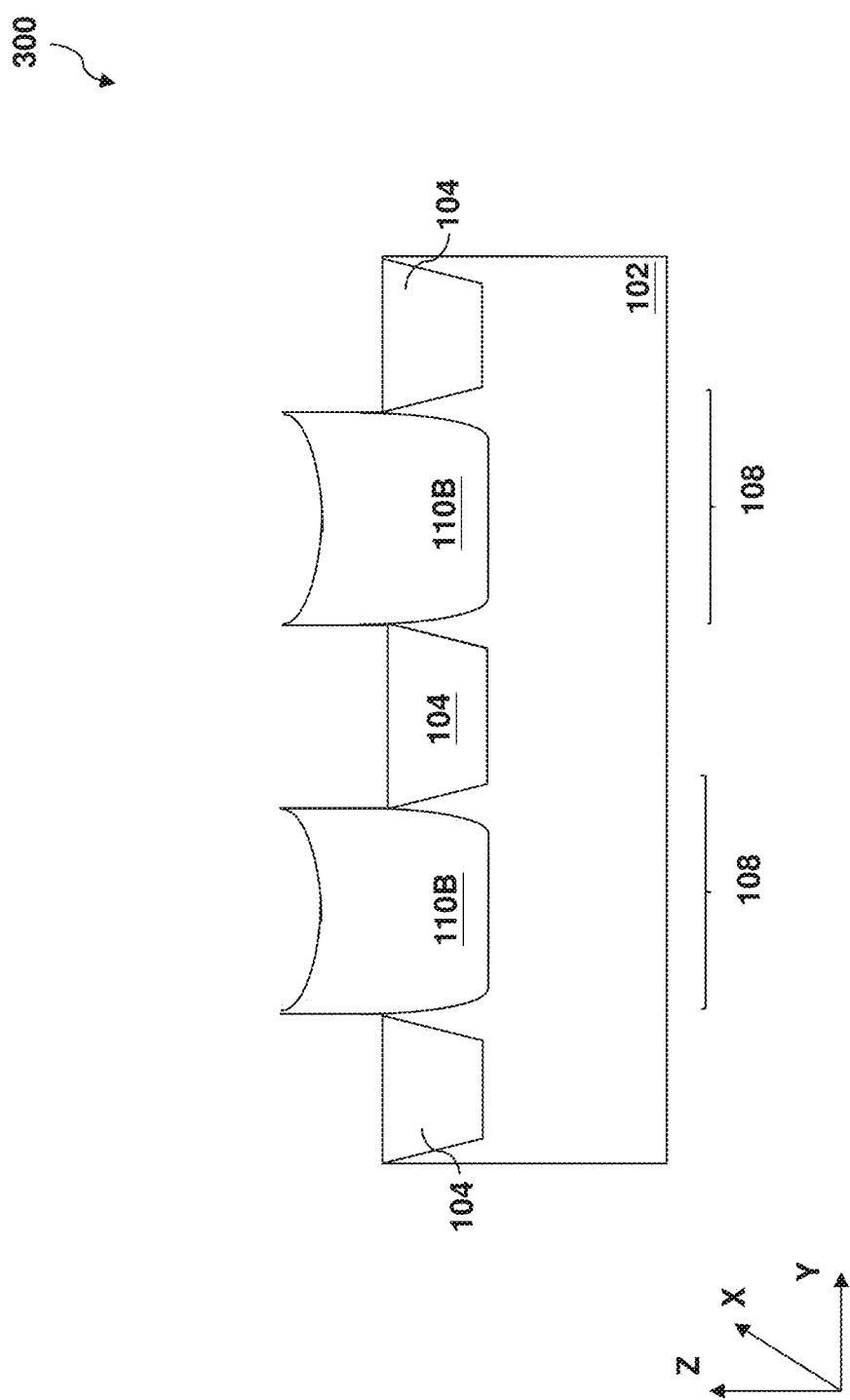

Referring to block 228 of FIG. 2 and to FIGS. 10A-10D, the method 200 proceeds to an operation to form a patterned photoresist layer 134 with an opening to expose second source/drain regions within a second area of the workpiece 300. In some embodiment, the second area includes various devices to be formed, such as memory devices. For examples, the memory devices may include static random-access memory devices. The patterned photoresist layer 134 is formed by lithography process with an opening defining the second area, as illustrated in FIG. 10A. In the present embodiment, the photoresist layer 134 is a tri-layer photoresist similar to that of the photoresist layer 130. For examples, the patterned photoresist layer 134 includes a bottom layer 134A, a middle layer 134B and photosensitive layer 134C to enhance lithography process with high resolution and etch resistance, as illustrated in FIG. 10B.

Referring to block 230 of FIG. 2 and to FIGS. 11A-11D, the method 200 may include an operation to perform a shallow recessing process to second source/drain regions within the second area of the workpiece 300. In the present embodiment, the shallow recessing process includes a dry etching process that may include one or more etching step that opens the dielectric layer 126 and recesses the second source/drain regions in the second area. Especially, the dry etching process recesses the second source/drain regions to form trenches with a second depth $D_2$, less than the first depth $D_1$. In some examples, the second depth ranges from 45 nm to 55 nm. In some examples, the dry etching process includes applying an etchant containing carbon oxide and hydrofluoric carbide.

Referring to block 232 of FIG. 2 and to FIGS. 12A-12D, the method 200 proceeds to an operation to perform a fin-sidewall-pull-back (FSWPB) process. The FSWPB process 232 removes or pulls back the dielectric layer 126 on the fin sidewalls in the second region. In the present embodiment, the FSWPB process includes a wet etching process to remove the dielectric layer 126 on the fin sidewalls in the second region. The wet etching process may include one or multiple etching steps to respective etchants to remove various films of the dielectric layer 126. After the FSWPB process, the adjacent fins within the second source/drain regions of the second area are not separated by the dielectric layer 126 and may be merged together during the subsequent epitaxial growth.

Referring to block 234 of FIG. 2 and to FIGS. 13A-13D, an epitaxial process is performed to form second source/drain features 136 on the substrate 102 in the second area. During the epitaxial process, the dummy gate stacks and/or the patterned photoresist layer 134 limit the source/drain features 136 to the source/drain regions in the second area. Suitable epitaxial processes include CVD deposition techniques (e.g., VPE and/or UHV-CVD), molecular beam epitaxy, and/or other suitable processes. The epitaxial process may use gaseous and/or liquid precursors, which interact with the composition of the substrate 102. The source/drain features 136 may be in-situ doped during the epitaxial process by introducing doping species including: p-type dopants, such as boron or $BF_2$; n-type dopants, such as phosphorus or arsenic; and/or other suitable dopants including combinations thereof. If the source/drain features 136 are not in-situ doped, an implantation process (i.e., a junction implant process) is performed to dope the source/drain features 136. In an exemplary embodiment, the source/drain features 136 in an NMOS device include SiP, while those in a PMOS device include GeSnB (tin may be used to tune the lattice constant) and/or SiGeSnB. One or more annealing processes may be performed to activate the source/drain features 136. Suitable annealing processes include rapid thermal annealing (RTA) and/or laser annealing processes.

Particularly, the source/drain features 136 on the adjacent fins are merged together during the epitaxial growth, which enhances the strain effect to the channel region 124 and increases the contact areas to the source/drain contact. In some embodiments, an air gap 138 is formed between the epitaxial grown source/drain feature 136 and the isolation feature 104 between the adjacent fins 108, as illustrated in FIG. 13D. The air gap 138 provides additional isolation function to the source/drain feature 136 in the second area. After the formation of the second source/drain features 136, the patterned photoresist layer 134 is removed by a suitable procedure similar to that of the patterned photoresist layer 130. Due to the different depths $D_1$ and $D_2$, the bottom surface of the first source/drain features 132 is below the bottom surface of the second source/drain features 136. The first source/drain features 132 are portions of a first FET 152 and the second source/drain features 136 are portions of a second FET 154.

Figure 14B:
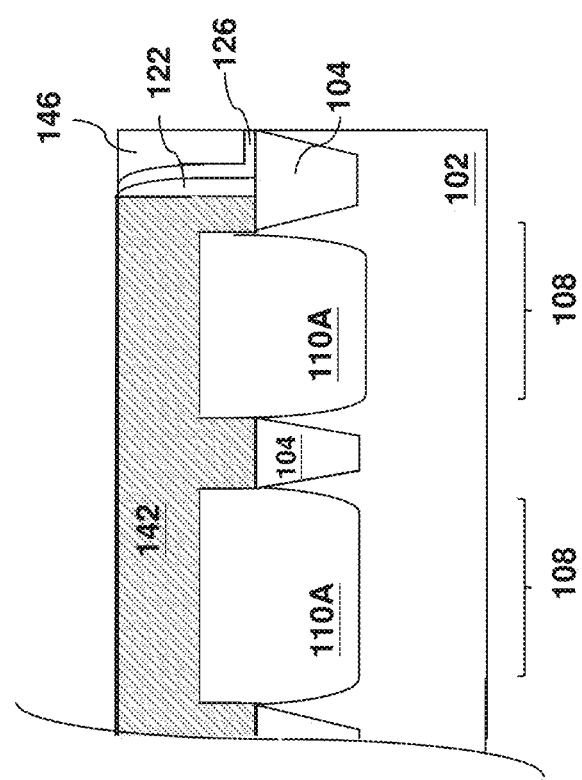
FIGS. 14B, 14C, 14D, 14E, and 14F are sectional views of the workpiece of FIG. 14A, in portion, taken along the dashed lines AA', BB', CC', DD', and EE', respectively, according to various aspects of the present disclosure.
Figure 14C:
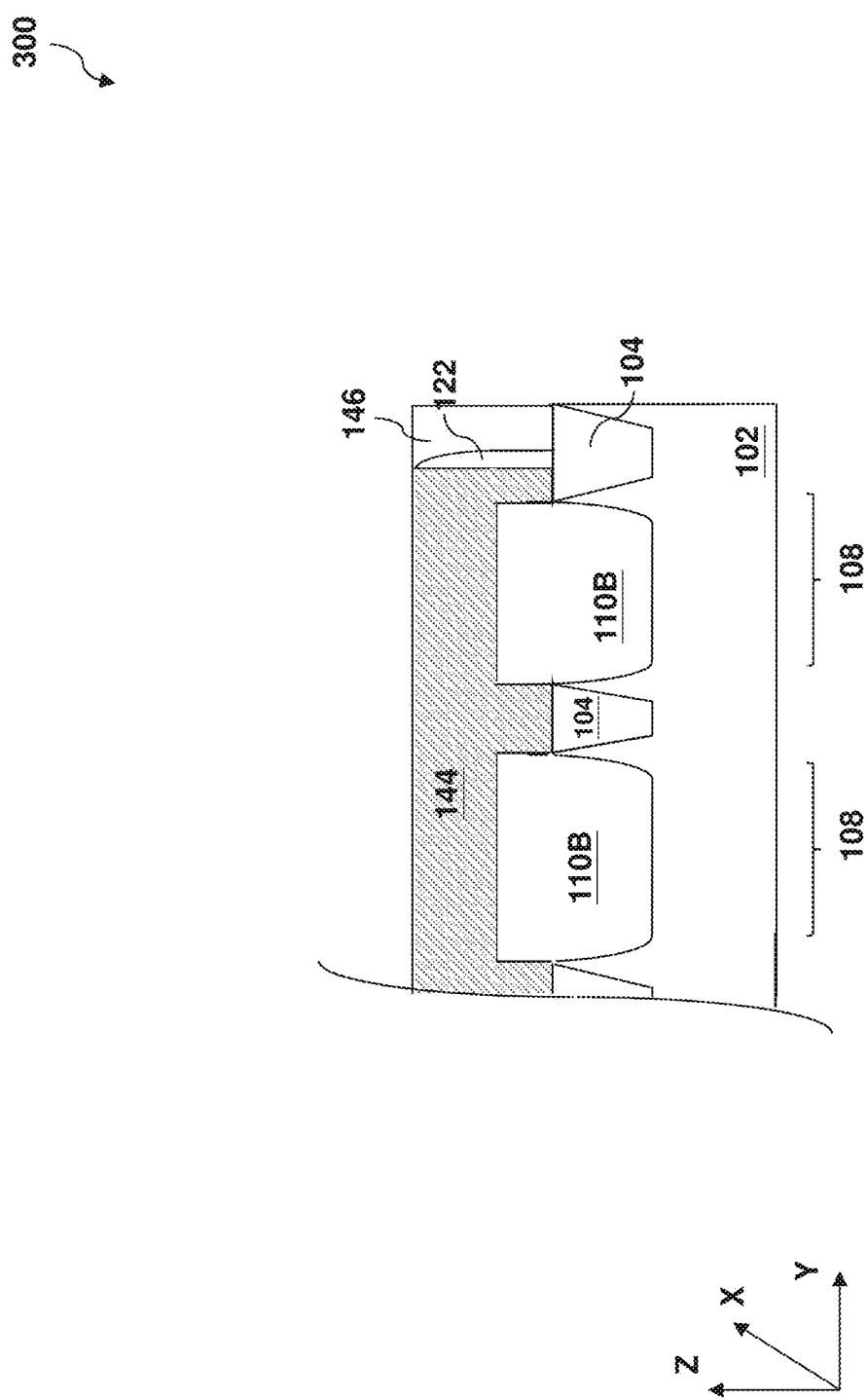
Figure 14D:
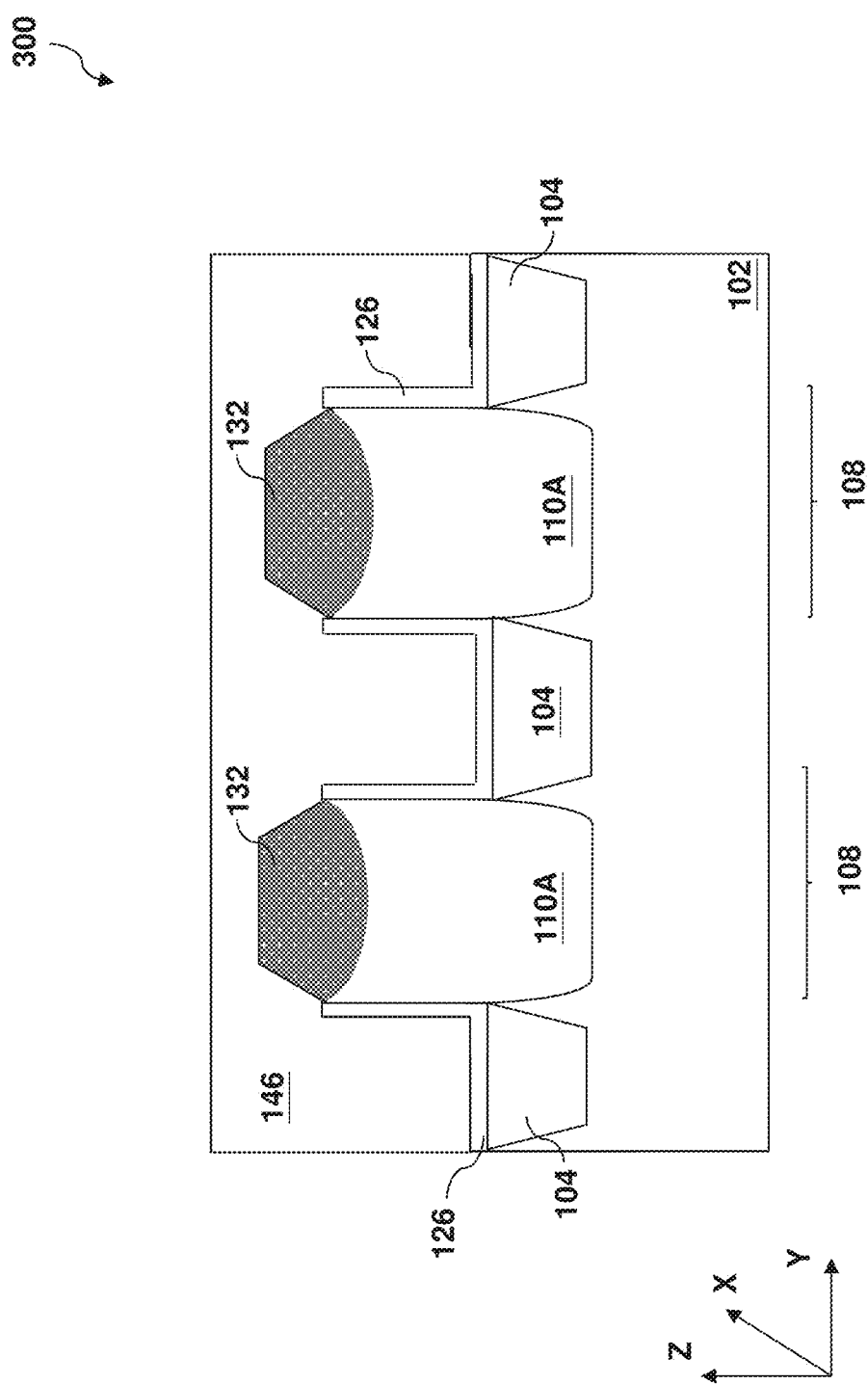

Referring back to block 216 of FIG. 1 and to FIGS. 14A-14F, the method 200 proceeds to form metal gate stacks to replace the dummy gate stacks. FIG. 14A is a top view of the workpiece 300 and FIGS. 14B-14F are sectional views of the workpiece 300, in portion, taken along the dashed lines AA', BB', CC', DD', and EE', respectively in accordance with some embodiments. For examples, the operation 216 forms a metal gate stack 142 to replace the dummy gate stack 112 as illustrated in FIG. 14B and a metal gate stack 144 to replace the dummy gate stack 114 as illustrated in FIG. 14C. The metal gate stack 142 is portion of the first FET 152 and the metal gate stack 144 is portion of the second FET 154. The formation of the metal gate stacks is further described below.

An inter-layer dielectric (ILD) layer 146 is formed on the workpiece 300 by deposition and polishing such as chemical mechanical polishing (CMP). Note that the ILD layer 146 is drawn to transparent in FIG. 14A in the top view so that various fins 108 and source/drain features (132 and 136) are visible for illustration. The ILD layer 146 acts as an insulator that supports and isolates conductive traces. The ILD layer 146 may include any suitable dielectric material, such as silicon oxide, doped silicon oxide such as borophosphosilicate glass (BPSG), tetraethylorthosilicate (TEOS) oxide, un-doped silicate glass, fluorinated silica glass (FSG), phosphosilicate glass (PSG), boron doped silicon glass (BSG), silicon nitride, silicon oxynitride, silicon carbide, low-k dielectric material, other suitable materials, and/or combinations thereof. The ILD layer 146 may be deposited by a PECVD process, a flowable CVD (FCVD) process, or other suitable deposition technique. A CMP process may follow to remove excessive dielectric materials and planarize the top surface. The hard mask 120 may be removed by the CMP. Alternatively, the hard mask 120 may function as polishing stop layer and is removed by additional etching process after the CMP.

The dummy gate stacks (such as 112 and 114), or portions thereof, are removed by etching, respectively or collectively. A selective etching process is applied to remove the dummy gate materials, such as polysilicon, resulting in gate trenches. The etching process may include any suitable etching technique such as wet etching, dry etching, RIE, ashing, and/or other etching methods. In an example, the etching process is a dry etching process using a fluorine-based etchant (e.g., $CF_4$, $CHF_3$, $CH_2F_2$, etc.). In some embodiments, etching includes multiple etching steps with different etching chemistries, each targeting a particular material of the dummy gate layers.

The gate trenches are filled by gate materials, such as gate dielectric layer and gate electrode, each including one or more material layers. In some such embodiments, the gate dielectric layer is deposited on the workpiece 300 by any suitable technique, such as ALD, CVD, metal-organic CVD (MOCVD), PVD, thermal oxidation, combinations thereof, and/or other suitable techniques. The gate dielectric layer may include a high-k dielectric material, such as a metal oxide (e.g., LaO, AlO, ZrO, TiO, $Ta_2O_5$, $Y_2O_3$, $SrTiO_3$ (STO), $BaTiO_3$ (BTO), $BaZrO$, HfZrO, HfLaO, HfTaO, HfTiO, $(Ba,Sr)TiO_3$ (BST), $Al_2O_3$, etc.) a metal silicate (e.g., HfSiO, LaSiO, AlSiO, etc.), a metal or semiconductor nitride, a metal or semiconductor oxynitride, combinations thereof, and/or other suitable materials. Likewise, a gate electrode is deposited on the gate dielectric layer. In particular, the gate electrode is electrically conductive. In various examples, the gate electrode may include a single layer or multiple layers, such as a metal layer, a liner layer, a wetting layer, and/or an adhesion layer. The gate electrode layer may further include a work function metal layer and a metal fill layer. The work function metal layer may include a p-type work function metal layer or an n-type work function metal layer. The p-type work function metal layer comprises a metal selected from, but not limited to, the group of titanium nitride (TiN), tantalum nitride (TaN), ruthenium (Ru), molybdenum (Mo), tungsten (W), platinum (Pt), or combinations thereof. The n-type work function metal layer comprises a metal selected from, but not limited to, the group of titanium (Ti), aluminum (Al), tantalum carbide (TaC), tantalum carbonitride (TaCN), tantalum silicon nitride (TaSiN), or combinations thereof. The p-type or n-type work function metal layer may further include a plurality of layers and may be deposited by CVD, PVD, and/or other suitable process. The metal fill layer may include aluminum (Al), tungsten (W), or copper (Cu) and/or other suitable materials. The metal fill layer may be formed by CVD, PVD, plating, and/or other suitable processes. After the deposition of the metal gate materials, a CMP process is performed to produce a substantially planar top surface of the metal gate stacks.

Figure 14E:
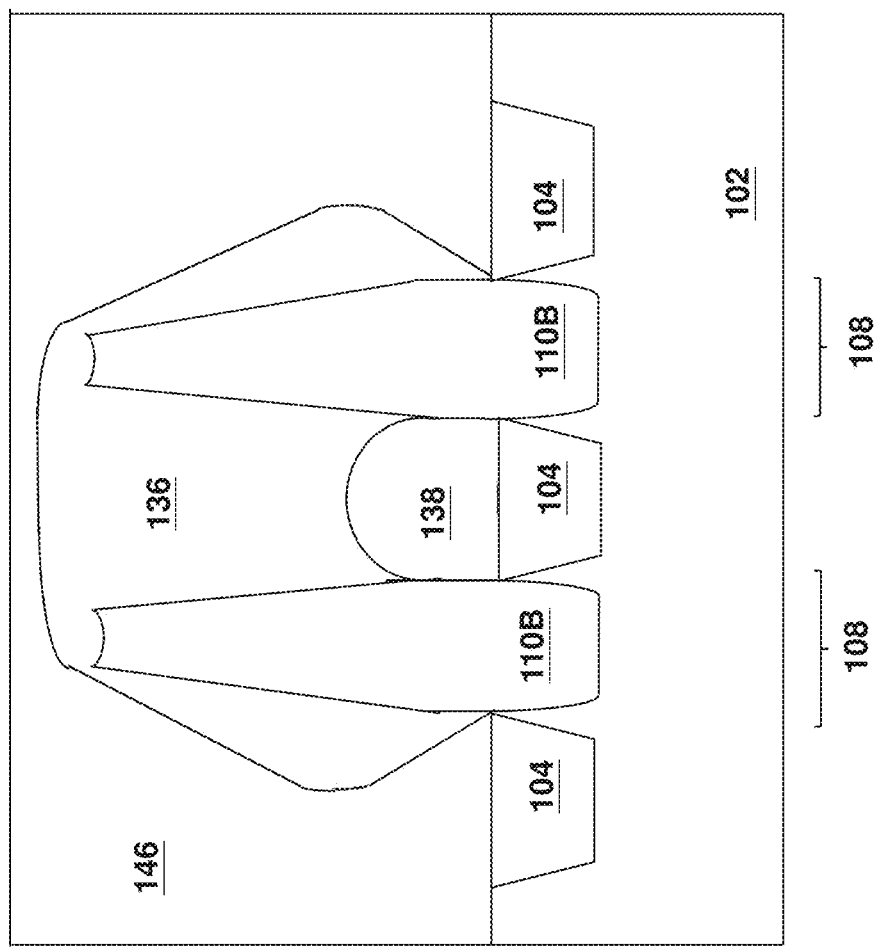
Figure 14F:
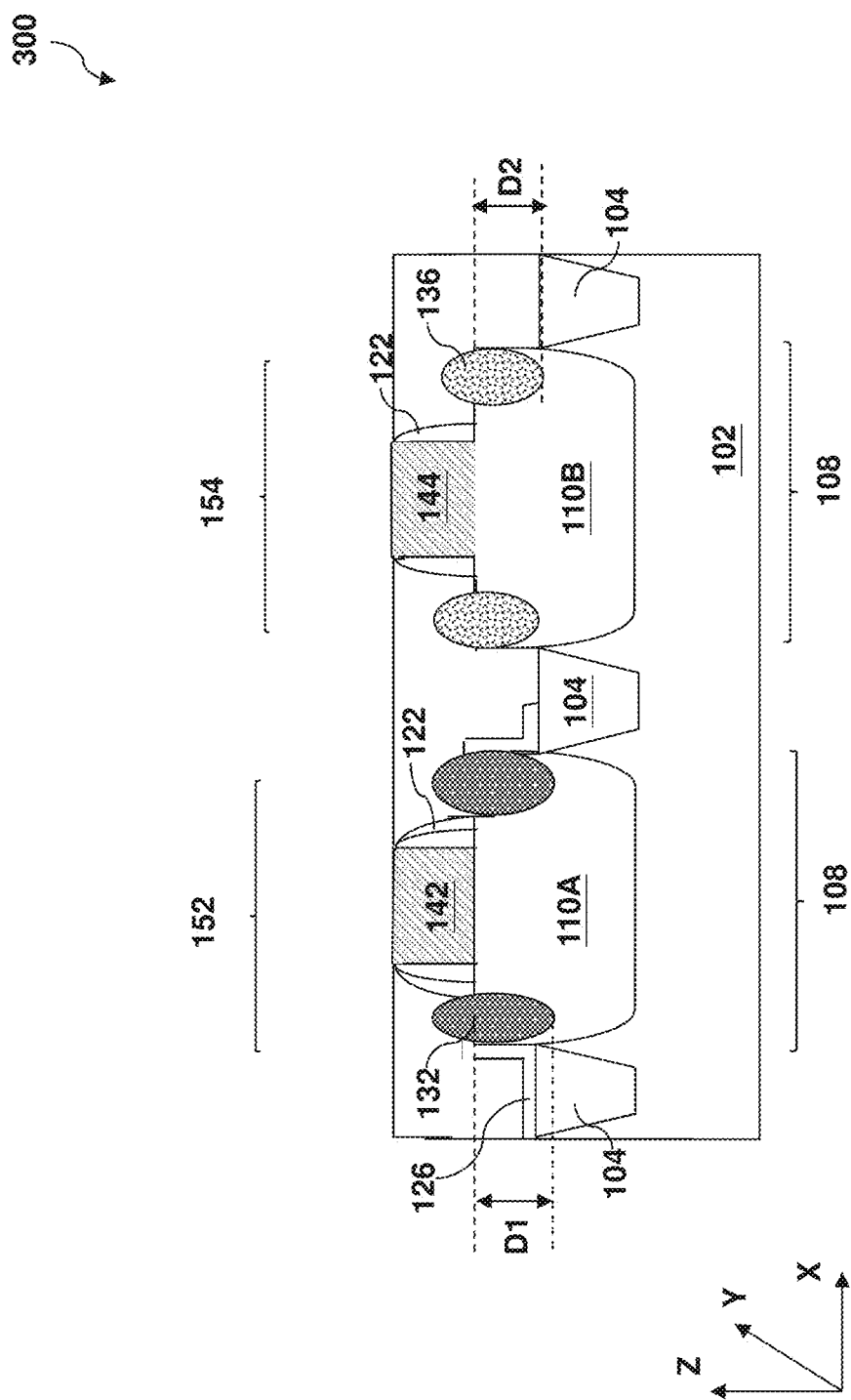

Thus, various devices including various FETs are formed on the substrate 102 with respective structure and procedure. Especially, the first and second source/drain features are formed by different processes and lead to respective structures as described above and further illustrated in FIGS. 14D and 14E, respectively. For an example as illustrated in FIG. 14E, the source/drain features 136 are directly formed on the sidewalls of the corresponding fin with enhanced carrier mobility. The source/drain features 136 from the adjacent fins are merged together to form common source/drain features with reduced contact resistance. The source/drain features 136 have a bottom surface higher than the bottom surface of the source/drain features 132 due to different depths $D_1$ and $D_2$, as illustrated in FIG. 14F.

The method 200 may proceed to further processes in order to complete the fabrication of the workpiece 300. For example, the method may proceed to operation 218 to form an interconnection structure to couple various devices to an integrated circuit. The interconnection structure includes metal lines in multiple metal layers for horizontal coupling and vias/contacts for vertical coupling between adjacent metal layers or between a bottom metal layer and the device features on substrate 102 (such as source/drain features and gate stacks). The interconnect structure includes one or more suitable conductive material, such as copper, aluminum alloy, tungsten, silicide or other suitable conductive material. The interconnection structure may be formed by damascene process, such as single damascene process or dual damascene process, which include, lithography patterning, etching deposition and CMP. For example, the conductive material can be deposited using suitable process, such as CVD, PVD, plating, and or other suitable processes. The illustrated workpiece 300 is merely an example of some embodiments of the method 200. The method 200 may have various other embodiments without departure of the scoped the present disclosure.

Furthermore, the semiconductor structure 200 as shown above may be intermediate devices fabricated during processing of an IC, or a portion thereof, that may comprise static random access memory (SRAM) and/or logic circuits, passive components such as resistors, capacitors, and inductors, and active components such as p-type field effect transistors (PFETs), n-type FETs (NFETs), multi-gate FETs such as FinFETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

The present disclosure provides a semiconductor structure and a method making the same. The method includes different procedure to form epitaxially grown source/drain features for various devices. Although not intended to be limiting, one or more embodiments of the present disclosure provides many benefits to a semiconductor device and the formation thereof, including FinFETs. For example, the two types of FETs are formed by different procedures. The first type may be logic devices and the second type may be memory devices. Especially, the second source/drain features for the second type FETs are formed by a procedure including a FSWPB process, which reduces the contact resistance and enhances the carrier mobility. The disclosed method provides freedom to treat different FETs differently and independently to meet respect specifications. However, the first-type FETs and the second type FETs are not limited to logic devices and memory devices, and can be other type devices with different specifications. For example, the first type FETs are p-type FETs and the second type FETs are n-type FETs, or vise verse according to the design consideration.

Thus, the present disclosure provides examples of a method making a semiconductor structure. The method includes forming a fin structure on the substrate, wherein the fin structure includes a first fin active region; a second fin active region; and an isolation feature separating the first and second fin active regions; forming a first gate stack on the first fin active region and a second gate stack on the second fin active region; performing a first recessing process to a first source/drain region of the first fin active region by a first dry etch; performing a first epitaxial growth to form a first source/drain feature on the first source/drain region; performing a fin sidewall pull back (FSWPB) process to remove a dielectric layer on the second fin active region; and performing a second epitaxial growth to form a second source/drain feature on a second source/drain region of the second fin active region.

The present disclosure also provides examples of a semiconductor structure. A semiconductor device. The semiconductor structure includes a semiconductor substrate; first and second fin active regions extending from the semiconductor substrate; a first field-effect transistor on the first fin active region; and a second field-effect transistor on the second fin active region. The first field-effect transistor includes a first gate stack disposed on a first channel region of the first fin active region and first epitaxial grown source/drain features disposed on opposite sides of the first channel region. The second field-effect transistor includes a second gate stack disposed on a second channel region of the second fin active region and second epitaxial source/drain features disposed on opposite sides of the second channel region. The first epitaxial grown source/drain features has a bottom surface below a bottom surface of the second epitaxial grown source/drain features.

The present disclosure provides other examples of a method making a semiconductor structure. The method includes forming a fin structure on the substrate, wherein the fin structure includes a first fin active region; a second fin active region; and an isolation feature separating the first and second fin active regions; forming a first gate stack on the first fin active region and a second gate stack on the second fin active region; performing a first recessing process to a first source/drain region on the first fin active region, wherein the first recessing process includes a first dry etch to recess the first fin active region; performing a first epitaxial growth to form a first source/drain feature on the first source/drain region; performing a second recessing process to a second source/drain region on the second fin active region, wherein the second recessing process includes a second dry etch to recess the second fin active region and a fin sidewall pull back (FSWPB) process to remove a dielectric layer on the second fin active region; and performing a second epitaxial growth to form a second source/drain feature on the second source/drain region. The first dry etch recesses the first fin active region to a first depth; the second dry etch recesses the second fin active region to a second depth; and the second depth is less than the first depth.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a semiconductor substrate;
   first, second, third and fourth fin active regions extruding from the semiconductor substrate and longitudinally extending along a first direction;
   a first and second gate stacks longitudinally extending along a second direction that is orthogonal to the first direction, wherein the first gate stack is disposed on the first and third fin active regions, and the second gate stack is disposed on the second and fourth fin active regions;
   a first field-effect transistor formed on the first fin active region, wherein the first field-effect transistor includes the first gate stack disposed on a first channel region of the first fin active region and first epitaxially grown source/drain features disposed on opposite sides of the first channel region;
   a second field-effect transistor formed on the second fin active region, wherein the second field-effect transistor includes the second gate stack disposed on a second channel region of the second fin active region and second epitaxially grown source/drain features disposed on opposite sides of the second channel region;
   a dielectric layer disposed over the semiconductor substrate;
   third epitaxially grown source/drain features formed on the third fin active region and disposed on opposite sides of the first gate stack; and
   fourth epitaxially grown source/drain features formed on the fourth fin active region and disposed on opposite sides of the second gate stack, wherein
   one of the second epitaxially grown source/drain features and a corresponding one of the fourth epitaxially grown source/drain features are merged into a common source/drain feature, defining an air gap under the common source/drain feature,
   one of the first epitaxially grown source/drain features and a corresponding one of the third epitaxially grown source/drain features are separated by the dielectric layer,
   the dielectric layer is disposed on a shallow trench isolation (STI) feature,
   the first fin active region includes a first sidewall vertically extending from a top surface of the STI feature,
   the third fin active region includes a second sidewall vertically extending from the top surface of the STI feature,
   the dielectric layer is continuously extending from the first sidewall of the first fin active region to the second sidewall of the third fin active region and fully covering the first and second sidewalls, and
   the dielectric layer is not in contact with the second and fourth epitaxially grown source/drain features.

2. The semiconductor device of claim 1, wherein the first field-effect transistor is a field-effect transistor of a first type conductivity, and the second field-effect transistor is a field-effect transistor of a second type conductivity opposite to the first type conductivity.

3. The semiconductor device of claim 1, wherein the first field-effect transistor is a first transistor for a logic device, and the second field-effect transistor is a second transistor for a memory device.

4. The semiconductor device of claim 1, wherein the air gap is interposed vertically between the common source/drain feature and the shallow trench isolation (STI) feature and laterally extends from the second fin active region to the fourth fin active region.

5. The semiconductor device of claim 4, wherein the air gap spans vertically from a top surface of the STI feature to the common source/drain feature.

6. The semiconductor device of claim 4, wherein the common source/drain feature in a sectional view taken along the second direction includes a top portion of a first width, a middle portion of a second width and a bottom portion of a third width, and wherein the second width is greater than the first and third widths.

7. The semiconductor device of claim 6, wherein each of the first and third epitaxially grown source/drain features in the sectional view taken along the second direction includes a portion above a top surface of the dielectric layer, and wherein the portion further includes a varying width that increases down toward to the semiconductor substrate.

8. The semiconductor device of claim 7, wherein
the first and third fin active regions are distanced away in the second direction with a first spacing,
the second and fourth fin active regions are distanced away in the second direction with a second spacing, the second direction being orthogonal to the first direction,
the second spacing is equal to the first spacing,
the first and third fin active regions are distanced away from the second and fourth fin active regions along the first direction, and
the first and third fin active regions are aligned along the first direction with the second and fourth fin active regions, respectively.

9. A semiconductor device, comprising:
a semiconductor substrate;
first, second, third and fourth fin active regions extruded from the semiconductor substrate and longitudinally oriented in a first direction, wherein the first and third fin active regions are disposed in a first area and distanced away in a second direction with a first spacing, wherein the second and fourth fin active regions are disposed in a second area and distanced away in the second direction with a second spacing, wherein the second direction is orthogonal to the first direction, wherein the second spacing is equal to the first spacing, wherein the first and third fin active regions are distanced away from the second and fourth fin active regions along the first direction, and wherein the first and third fin active regions are aligned along the first direction with the second and fourth fin active regions, respectively;
a first gate stack disposed on the first and third fin active regions;
a second gate stack disposed on the second and fourth fin active regions;
a first epitaxially grown source/drain (S/D) feature formed on the first fin active region and being disposed adjacent the first gate stack;
a second epitaxially grown S/D feature formed on the second fin active region and being disposed adjacent the second gate stack;
a third epitaxially grown S/D feature formed on the third fin active region and being disposed adjacent the first gate stack; and
a fourth epitaxially grown S/D feature formed on the fourth fin active region and being disposed adjacent the second gate stack, wherein
the second and fourth epitaxial grown S/D features are merged into a common S/D feature, defining an air gap vertically between the common S/D feature and a shallow trench isolation (STI) feature, and
the first and third epitaxial grown S/D features are separated from each other.

10. The semiconductor device of claim 9, further comprising a dielectric layer disposed on the first and third epitaxial grown S/D features, wherein the dielectric layer is not in contact with the common S/D feature.

11. The semiconductor device of claim 9, wherein the first gate stack and the first epitaxial grown S/D feature form a first field-effect transistor of a first type conductivity, and the second gate stack and the common S/D feature forms a second field-effect transistor of a second type conductivity opposite to the first type conductivity.

12. The semiconductor device of claim 9, wherein the first gate stack and the first epitaxially grown S/D feature form a first field-effect transistor as a logic device, and the second gate stack and the second epitaxially grown S/D feature form a second field-effect transistor as a memory device.

13. The semiconductor device of claim 9, wherein
the common S/D feature is directly in contact with the second and fourth fin active regions;
the second fin active region includes an outer edge and an inner edge both extending from a top surface of the STI feature in a sectional view cut along the second direction;
the fourth fin active region includes an outer edge and an inner edge both extending from the top surface of the STI feature in the sectional view cut along the second direction; and
the common S/D feature completely covers the outer edge of the second fin active region and the outer edge of the fourth fin active region, and partially covers the inner edge of the second fin active region and the inner edge of the fourth fin active region.

14. The semiconductor device of claim 9, wherein the common S/D feature in a sectional view taken along the second direction includes a top portion of a first width, a middle portion of a second width and a bottom portion of a third width, and wherein the second width is greater than the first and third widths.

15. The semiconductor device of claim 14, wherein
the first and third fin active regions are separated by the STI feature;
the first and third epitaxial grown S/D features are separated from each other by a dielectric layer disposed on a top surface of the STI feature and continuously extending from a first sidewall of the first fin active region to a second sidewall of the third fin active region; and
each of the first and third epitaxial grown S/D features in a sectional view taken along the second direction includes a portion above a top surface of the dielectric layer, and wherein the portion further includes a varying width that increases down toward to the semiconductor substrate.

16. The semiconductor device of claim 15, wherein
the air gap spans vertically from a top surface of the STI feature to the common S/D feature; and
the dielectric layer fully covers the first sidewall of the first fin active region above the STI feature and the second sidewall of the third fin active region above the STI feature.

17. A semiconductor device, comprising:
a semiconductor substrate;
a first, second, third and fourth fin active regions extruding from the semiconductor substrate and longitudinally extending along a first direction;
a first and second gate stacks longitudinally extending along a second direction, wherein the first gate stack is disposed on the first and third fin active regions, and the second gate stack is disposed on the second and fourth fin active regions;

a first epitaxially grown source/drain feature formed on the first fin active region and disposed on a first side of the first gate stack;

a second epitaxially grown source/drain feature formed on the second fin active region and disposed on a first side of the second gate stack;

a third epitaxially grown source/drain feature formed on the third fin active region and disposed on the first side of the first gate stack;

a fourth epitaxially grown source/drain feature formed on the fourth fin active region and disposed on the first side of the second gate stack; and a dielectric layer disposed over the semiconductor substrate, wherein the first and third epitaxially grown source/drain features are separated by the dielectric layer, the second and fourth epitaxially grown source/drain features are merged into a common source/drain (S/D) feature, defining an air gap vertically between the common S/D feature and a shallow trench isolation (STI) feature, the first epitaxially grown source/drain feature extends into the first fin active region by a first depth that spans between a top surface of the first fin active region to a bottommost point of the first epitaxially grown source/drain feature, the second epitaxially grown source/drain feature extends into the second fin active region by a second depth that spans between a top surface of the second fin active region to a bottommost point of the second epitaxially grown source/drain feature, and the first depth is greater than the second depth.

18. The semiconductor device of claim 17, wherein the dielectric layer is not in contact with the common S/D feature.

19. The semiconductor device of claim 17, wherein the air gap laterally extends on a top surface of the STI feature from the second fin active region to the fourth fin active region along the second direction.

20. The semiconductor device of claim 17, wherein the dielectric layer continuously extends from the first epitaxially grown source/drain feature to a vertical sidewall of the first fin active region, to the STI feature, to a vertical sidewall of the third fin active region, and to the third epitaxially grown source/drain feature along the second direction, the dielectric layer fully covering the vertical sidewalls of the first and second fin active regions.

* * * * *